United States Patent
Gerboni et al.

(10) Patent No.: US 12,527,637 B2
(45) Date of Patent: Jan. 20, 2026

(54) SYSTEMS FOR RETRACTING AND ADJUSTING ELONGATE FLEXIBLE DEVICES AND ASSOCIATED METHODS

(71) Applicant: INTUITIVE SURGICAL OPERATIONS, INC., Sunnyvale, CA (US)

(72) Inventors: Giada Gerboni, San Francisco, CA (US); Sang Gyum Kim, San Jose, CA (US); Benjamin G. Cohn, Oakhurst, CA (US)

(73) Assignee: INTUITIVE SURGICAL OPERATIONS, INC., Sunnyvale, CA (US)

( * ) Notice: Subject to any disclaimer, the term of this patent is extended or adjusted under 35 U.S.C. 154(b) by 239 days.

(21) Appl. No.: 18/254,841

(22) PCT Filed: Nov. 29, 2021

(86) PCT No.: PCT/US2021/072624
§ 371 (c)(1),
(2) Date: May 26, 2023

(87) PCT Pub. No.: WO2022/115877
PCT Pub. Date: Jun. 2, 2022

(65) Prior Publication Data
US 2024/0024047 A1 Jan. 25, 2024

Related U.S. Application Data

(60) Provisional application No. 63/119,532, filed on Nov. 30, 2020.

(51) Int. Cl.
*A61M 25/01* (2006.01)
*A61B 18/00* (2006.01)
(Continued)

(52) U.S. Cl.
CPC .............. *A61B 34/30* (2016.02); *A61B 18/00* (2013.01); *A61B 34/20* (2016.02);
(Continued)

(58) Field of Classification Search
CPC ......... A61B 34/30; A61B 18/00; A61B 34/20; A61B 2018/00577; A61B 2034/2057;
(Continued)

(56) References Cited

U.S. PATENT DOCUMENTS 6,380,732 B1  4/2002  Gilboa
6,389,187 B1  5/2002  Greenaway et al.
(Continued)

FOREIGN PATENT DOCUMENTS

WO  WO-2019027922 A1  2/2019
WO  WO-2020014207 A1  1/2020
WO  WO-2020072415 A1  4/2020

OTHER PUBLICATIONS

International Preliminary Report on Patentability for Application No. PCT/US2021/072624 mailed Jun. 15, 2023, 12 pages.
(Continued)

*Primary Examiner* — Masud Ahmed
(74) *Attorney, Agent, or Firm* — Haynes & Boone, LLP.

(57) ABSTRACT

Systems for performing a medical procedure and associated methods and devices are disclosed herein. In some embodiments, a system for performing a medical procedure includes an elongate flexible device including a proximal portion, a distal portion, and a lumen extending therebetween. The lumen is configured to receive a medical instrument positioned within a target when the elongate flexible device is positioned toward the target. The system is configured to perform operations comprising determining the pose of the distal portion of the elongate flexible device based on sensor data from a sensor system; retracting, via a
(Continued)

control system, the elongate flexible device relative to the medical instrument and away from the target; and adjusting, via the control system, the pose of the distal portion of the elongate flexible device so the distal portion remains oriented toward the target.

20 Claims, 13 Drawing Sheets

(51) Int. Cl.
    *A61B 34/20*     (2016.01)
    *A61B 34/30*     (2016.01)

(52) U.S. Cl.
    CPC .............. *A61B 2018/00577* (2013.01); *A61B 2034/2057* (2016.02); *A61B 2034/301* (2016.02)

(58) Field of Classification Search
CPC ... A61B 2034/301; A61B 34/25; A61B 34/37; A61B 34/71; A61B 90/361; A61B 90/37; A61B 2018/00779; A61B 2018/00791; A61B 2018/00827; A61B 2018/00845; A61B 2018/00875; A61B 2018/00886; A61B 2034/2051; A61B 2034/2055; A61B 2034/2059; A61B 2090/064; A61B 2090/0807; A61B 2090/3735; A61B 2090/374; A61B 2090/376; A61B 2090/3762; A61B 2090/378; A61B 2090/3937; A61B 2218/002; A61B 2218/007

See application file for complete search history.

(56) References Cited

U.S. PATENT DOCUMENTS

| | | | |
|---|---|---|---|
| 6,610,007 B2 * | 8/2003 | Belson | A61B 1/008 604/95.01 |
| 7,316,681 B2 | 1/2008 | Madhani et al. | |
| 7,772,541 B2 | 8/2010 | Froggatt et al. | |
| 7,781,724 B2 | 8/2010 | Childers et al. | |
| 7,862,572 B2 * | 1/2011 | Meade | A61B 17/0482 606/145 |
| 7,862,573 B2 * | 1/2011 | Darois | B25B 23/065 606/139 |
| 8,062,306 B2 * | 11/2011 | Nobis | A61B 17/29 606/174 |
| 8,900,131 B2 | 12/2014 | Chopra et al. | |
| 9,017,345 B2 * | 4/2015 | Taylor | A61B 17/068 606/142 |
| 9,259,274 B2 | 2/2016 | Prisco | |
| 9,452,276 B2 | 9/2016 | Duindam et al. | |
| 11,109,920 B2 * | 9/2021 | Al-Jadda | A61B 34/37 |
| 2011/0295247 A1 * | 12/2011 | Schlesinger | B25J 9/1689 606/41 |
| 2012/0271285 A1 * | 10/2012 | Sholev | A61B 17/068 606/1 |
| 2017/0265952 A1 | 9/2017 | Donhowe et al. | |
| 2019/0231449 A1 | 8/2019 | Diolaiti et al. | |
| 2020/0030575 A1 * | 1/2020 | Bogusky | A61M 16/0488 |

OTHER PUBLICATIONS

International Search Report and Written Opinion for Application No. PCT/US2021/072624, mailed May 12, 2022, 19 pages.
Invitation to Pay Additional Fees and Partial International Search Report for PCT/US2021/072624, mailed Mar. 17, 2022, 13 pages.
Vertut, J, and Coiffet, P., "Robot Technology: Teleoperation and Robotics Evolution and Development," English translation, Prentice-Hall, Inc., Inglewood Cliffs, NJ, USA 1986, vol. 3A, 332 pages.

* cited by examiner

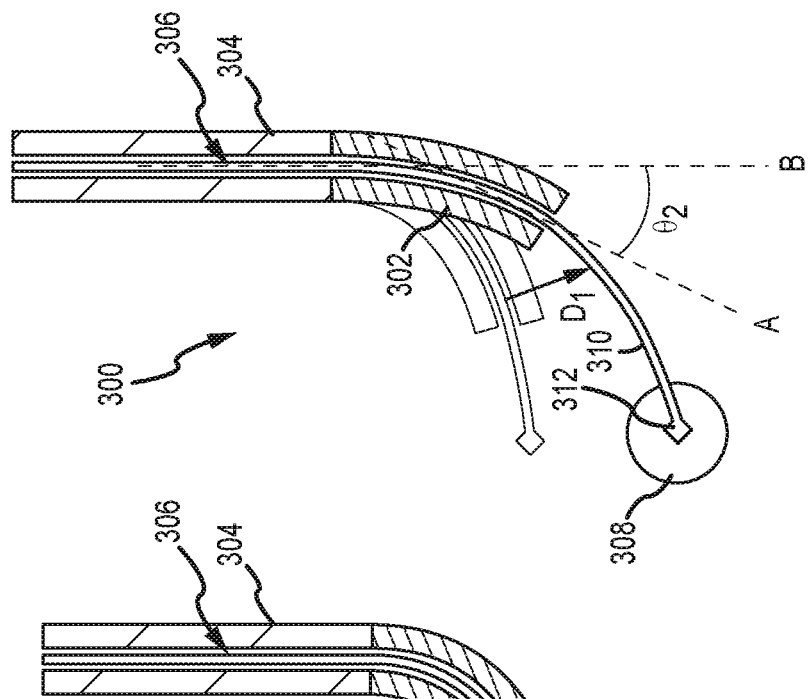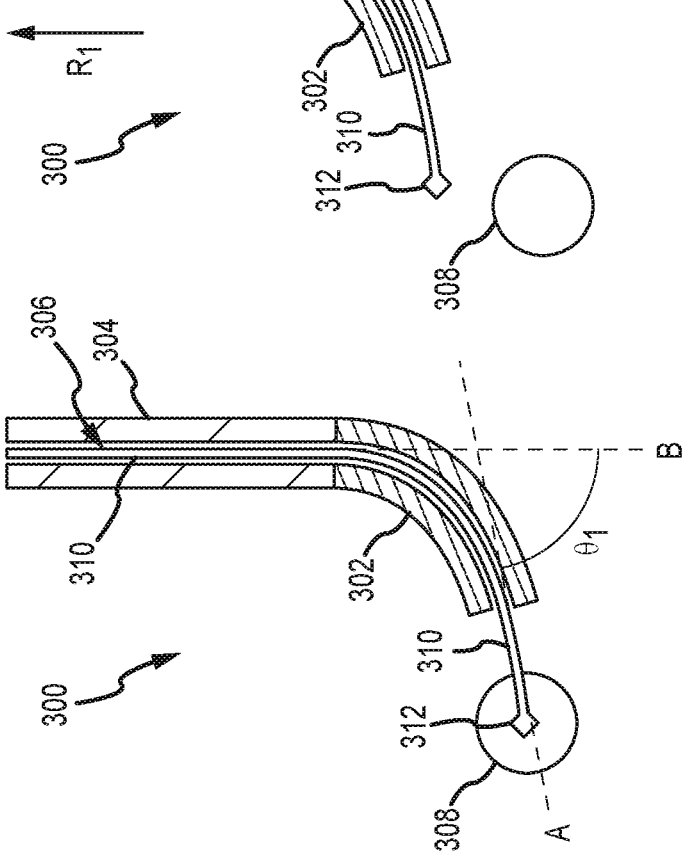

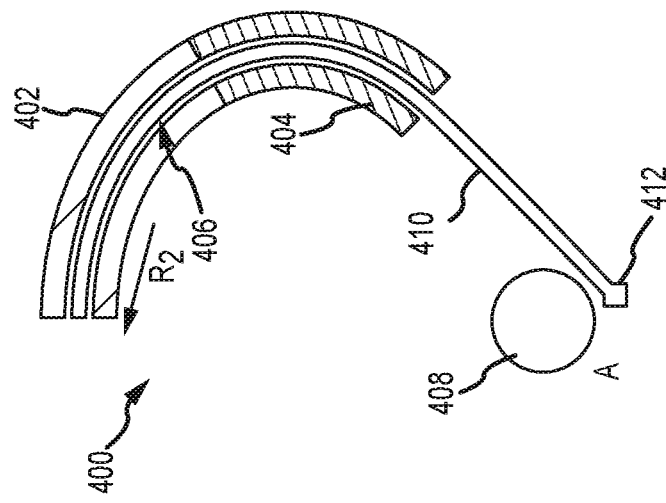
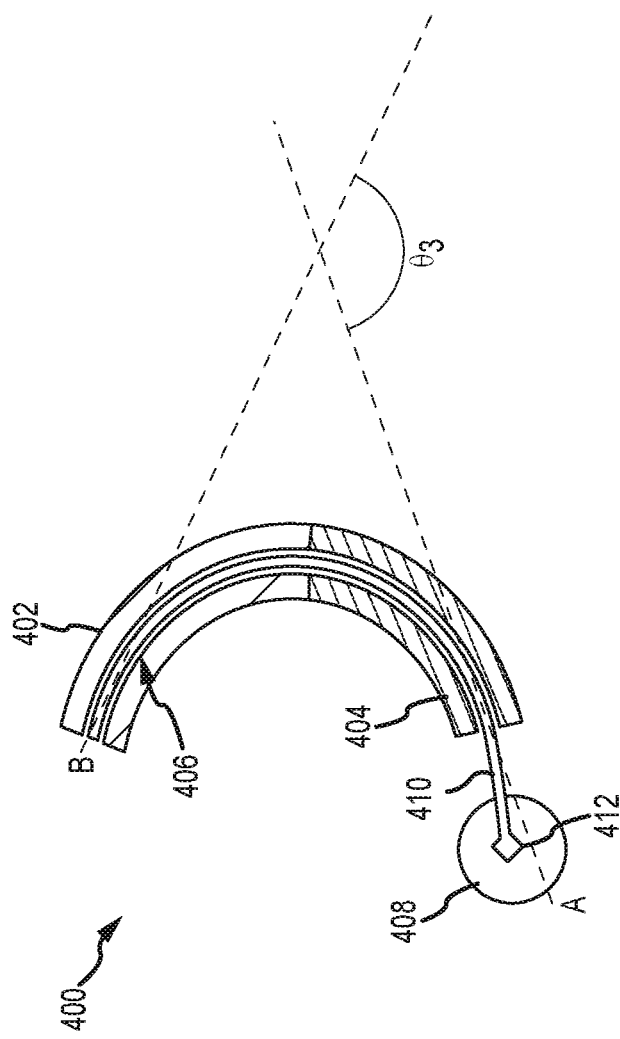
FIG.4B
FIG.4A

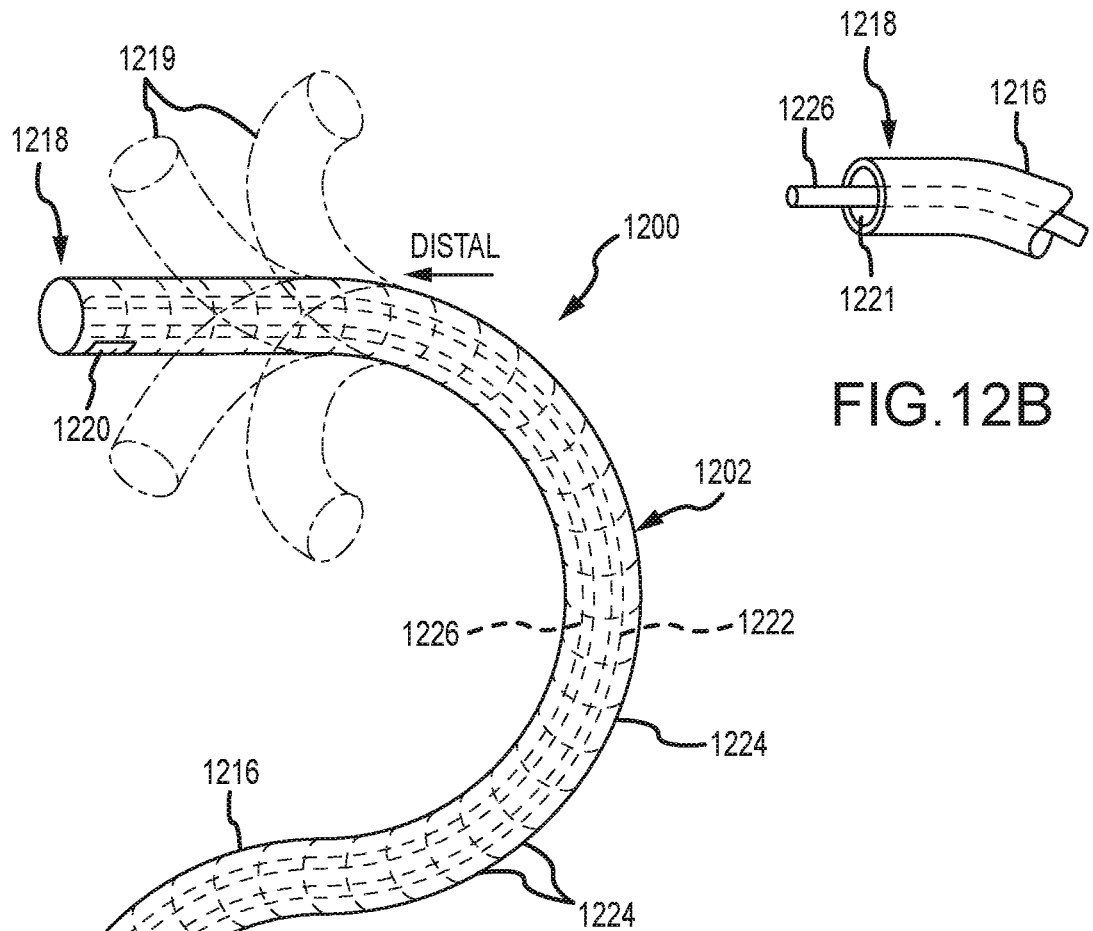
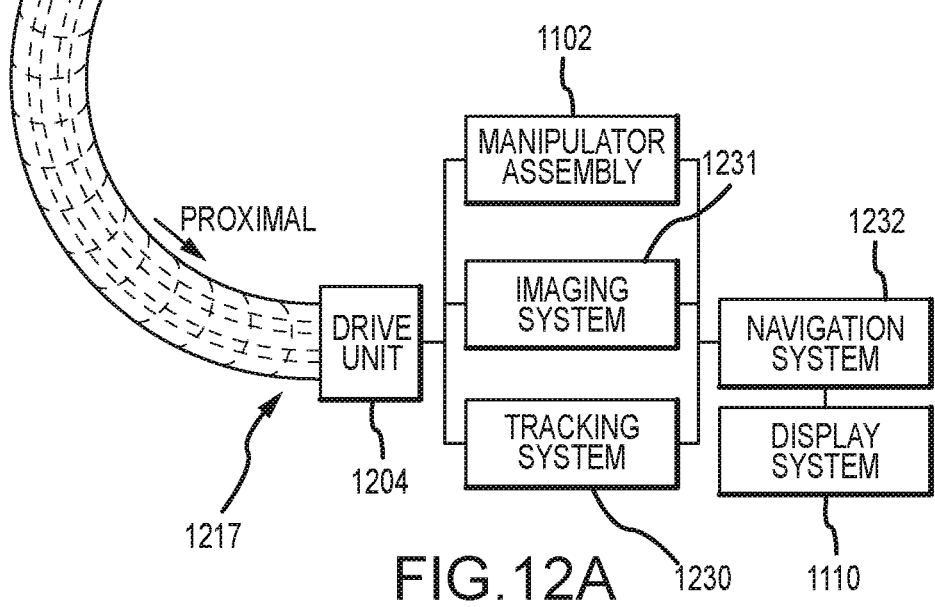
FIG. 12B
FIG. 12A

SYSTEMS FOR RETRACTING AND ADJUSTING ELONGATE FLEXIBLE DEVICES AND ASSOCIATED METHODS

CROSS-REFERENCE TO RELATED APPLICATION(S)

This patent application is the U.S. National Stage patent application of International Patent Application No. PCT/US2021/072624 filed on Nov. 29, 2021 which claims priority to and the benefit of U.S. Provisional Patent Application No. 63/119,532 filed Nov. 30, 2020, each of which is incorporated herein by reference in its entirety.

TECHNICAL FIELD

The present disclosure is directed to systems for retracting and adjusting elongate flexible devices and associated methods of use.

BACKGROUND

Minimally invasive medical techniques are intended to reduce the amount of tissue that is damaged during medical procedures, thereby reducing patient recovery time, discomfort, and harmful side effects. Such minimally invasive techniques may be performed through natural orifices in a patient anatomy or through one or more surgical incisions. Through these natural orifices or incisions, an operator may insert minimally invasive medical tools to reach a target tissue location. Minimally invasive medical tools include instruments such as therapeutic, diagnostic, biopsy, and surgical instruments. Minimally invasive medical tools may also include ablation instruments. Ablation instruments transmit energy, e.g., in the form of electromagnetic waves to a targeted area of tissue, such as a tumor or other growth, within the patient anatomy to destroy the targeted tissue. Some minimally invasive medical tools and ablation instruments may be teleoperated or otherwise computer-assisted or delivered by a teleoperated, robotic, or otherwise computer-assisted system. Various features may improve the effectiveness of minimally invasive medical tools and ablation instruments.

SUMMARY

Embodiments of the present technology are best summarized by the claims that follow the description.

In some embodiments, a system for performing a medical procedure comprises an elongate flexible device including a proximal portion, a distal portion, and a lumen extending therebetween. The lumen is configured to receive a medical instrument positioned within a target when the elongate flexible device is positioned toward the target. The system also comprises a sensor system configured to provide sensor data indicative of a pose of the distal portion of the elongate flexible device; a control system configured to actuate at least a portion of the elongate flexible device; a processor operably coupled to the elongate flexible device, the sensor system, and the control system; and a memory operably coupled to the processor. The memory stores instructions that, when executed by the processor, cause the system to perform operations comprising: determining the pose of the distal portion of the elongate flexible device based on the sensor data from the sensor system; retracting, via the control system, the elongate flexible device relative to the medical instrument and away from the target; and adjusting, via the control system, the pose of the distal portion of the elongate flexible device so the distal portion remains oriented toward the target.

In these and other embodiments, a method for performing a medical procedure using an elongate flexible device comprises receiving a medical instrument within a lumen of the elongate flexible device; receiving an input command to position a distal tip section of the medical instrument within a target near a distal portion of the elongate flexible device; determining a pose of the distal portion of the flexible elongate device based on data from at least one sensing system; retracting the elongate flexible device away from the distal tip section of the medical instrument; and adjusting the pose of the distal portion of the elongate flexible device based, at least in part, on the data from the at least one sensing system such that the distal tip section of the medical instrument remains substantially positioned within the target during the retracting and the adjusting of the elongate flexible device.

In these and still other embodiments, a system for performing a medical procedure at a target site is provided. The system comprises an elongate flexible device including a distal portion configured to be positioned near the target site, the elongate flexible device including at least one sensor. The system also comprises a processor operably coupled to the at least one sensor and a memory operably coupled to the processor. The memory stores instructions that, when executed by the processor, cause the system to output a user interface for providing guidance. The guidance comprises a first indicator representing a current pose of the distal portion of the elongate flexible device, the current pose being based on data from the at least one sensor. The guidance also comprises a second indicator corresponding to a target movement range for adjusting the distal portion of the elongate flexible device to remain oriented toward the target site during retraction of the elongate flexible device away from the target site.

In these and other embodiments, a method for performing a medical procedure at a target site comprises determining a current pose of a distal portion of an elongate flexible device positioned near a target site based on data received from at least one pose sensor associated with the elongate flexible device. The method also comprises determining an adjusted pose of the distal portion of the elongate flexible device. The adjusted pose orients the distal portion of the elongate flexible device toward the target site during retraction of the elongate flexible device away from the target site. The method further comprises providing guidance for adjusting the distal portion of the elongate flexible device from the current pose to the adjusted pose. The guidance includes a target movement range.

In these and further embodiments, a non-transitory, computer-readable medium is provided. The non-transitory, computer-readable instructions stores instructions thereon that, when executed by one or more processors of a computing system, cause the computing system to perform the method of any of the embodiments described herein.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one skilled in the art from the following detailed description.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

FIGS. 3A-3C are partially schematic cross-sectional views of an elongate flexible device during a retraction and adjustment procedure, in accordance with various embodiments of the present technology.

FIGS. 4A-4C are partially schematic cross-sectional views of an elongate flexible device during another retraction and adjustment procedure, in accordance with various embodiments of the present technology.

FIG. 12A is a simplified diagram of a medical instrument system configured in accordance with various embodiments of the present technology.

FIG. 12B is a simplified diagram of a medical instrument system configured in accordance with various embodiments of the present technology.

DETAILED DESCRIPTION

Figure 1:
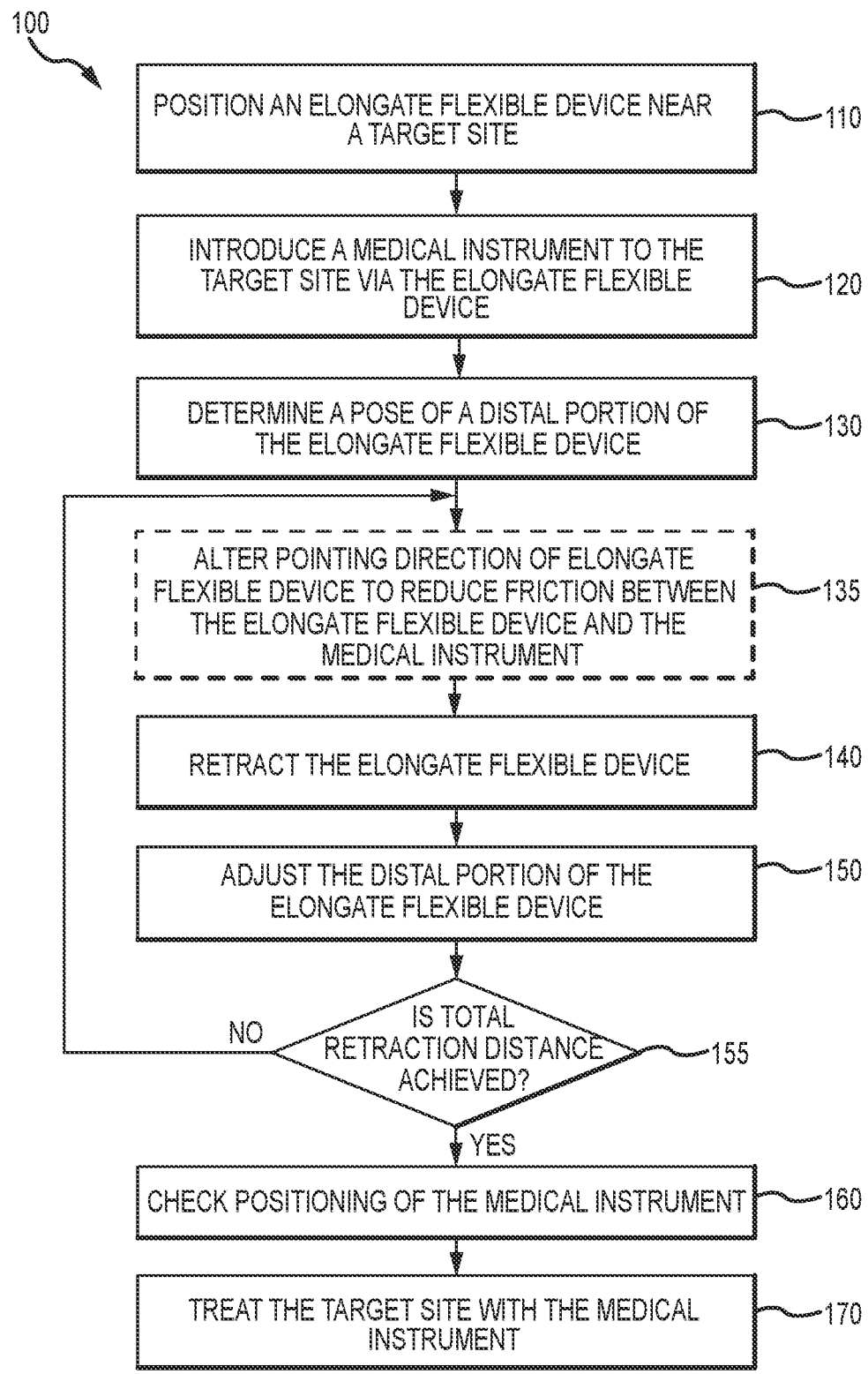
FIG. 1 is a flow diagram illustrating a method for performing a medical procedure in accordance with various embodiments of the present technology.

The present disclosure is directed to minimally invasive devices and systems for performing medical procedures and associated methods. In some embodiments, a system for performing a medical procedure in an anatomic region of a patient (e.g., the airways of the lungs) includes an elongate flexible device (e.g., a flexible catheter) configured to be inserted into the patient. The elongate flexible device can include a lumen or channel extending therethrough for receiving a medical instrument. For example, the medical instrument can be a device used for a diagnostic or treatment procedure, such as an energy delivery instrument (e.g., an ablation probe) configured to transmit electromagnetic waves to increase the temperature at a target site (e.g., a tumor) in the anatomy of the patient. The energy delivery instrument can be deployed through the lumen of the elongate flexible device to the target site, with the antenna positioned within, at, or near the target site.

To reduce or avoid interference with energy delivery and/or damage to the elongate flexible device, the distal portion of the elongate flexible device can be retracted away from the target site and/or from the antenna before the ablation procedure commences. During such retraction, however, the positioning of the energy delivery instrument may shift. Additionally, in some embodiments, the elongate flexible device may be configured to "relax" (i.e., return to a passive state) during retraction for safety reasons, which can cause the elongate flexible device to straighten and dislodge or shift the energy delivery instrument from or within the target site. If the energy delivery instrument shifts too far from the target site, the energy delivery instrument may not be able to apply energy to the correct location. Although the operator can attempt to manually hold the energy delivery instrument in place during retraction, this can be inconvenient and unreliable. Additionally, if the energy delivery instrument shifts or becomes dislodged during retraction, it may be difficult and time-consuming for the operator to reposition the energy delivery instrument back to the target site after retraction.

Accordingly, to overcome these and other challenges, the systems described herein can be configured to maintain the desired positioning of an energy delivery instrument (or other medical instrument) with respect to a target site during retraction by controlling the pose of the elongate flexible device carrying the instrument. In some embodiments, for example, the systems described herein are configured to determine a pose of the distal portion of the elongate flexible device, e.g., based on data from at least one sensor carried by the elongate flexible device. The system can retract the elongate flexible device away from the target site and/or relative to the medical instrument. During and/or after retraction, the system can adjust the pose of the distal portion of the elongate flexible device so the distal portion remains oriented toward the target site and the medical instrument remains in the correct position relative to the target site. The adjusting and retracting steps can each be performed automatically or semi-automatically by the system, or can be performed based on operator input with optional movement constraints imposed by the system.

Additionally, in some embodiments, the systems described herein are configured to guide an operator during the retraction and/or adjustment procedure. For example, the system can be configured to output a guidance, such as a graphical user interface including (a) a first indicator representing a current pose of the distal portion of the elongate flexible device, and (b) a second indicator configured to guide the operator in adjusting the distal portion of the elongate flexible device to remain oriented appropriately with the target site. The second indicator can correspond to a target movement range to keep the distal portion of the elongate flexible device oriented appropriately, such as a movement plane, range of bend angles, range of bend radii, target position and/or orientation, etc. The system can update the graphical user interface as the operator retracts the elongate flexible device away from the target site, thus providing real-time or near-real-time guidance for the retraction and/or adjustment processes described herein.

Specific details of several embodiments of the present technology are described herein with reference to FIGS. 1-12B. Although many of the embodiments are described below in the context of navigating and performing medical procedures within lungs of a patient, other applications and other embodiments in addition to those described herein are within the scope of the present technology. For example, unless otherwise specified or made clear from context, the devices, systems, and methods of the present technology can be used for navigating and performing medical procedures on, in, or adjacent other patient anatomy, such as the urinary tract (e.g., kidneys), GI system, and/or heart of a patient.

It should be noted that other embodiments in addition to those disclosed herein are within the scope of the present technology. For example, although certain embodiments herein are discussed with reference to energy delivery instruments, this is not intended to be limiting, and the present technology can also be applied to other types of medical instruments, such as instruments used for diagnosis, treatment, or other medical procedures. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

This disclosure describes various instruments and portions of instruments in terms of their state in three-dimensional space. As used herein, the term "position" refers to the location of an object or a portion of an object in a three-dimensional space (e.g., three degrees of translational freedom along Cartesian x-, y-, and z-coordinates). As used herein, the term "orientation" refers to the rotational placement of an object or a portion of an object (three degrees of rotational freedom—e.g., roll, pitch, and yaw). As used herein, the term "pose" refers to the position of an object or a portion of an object in at least one degree of translational freedom and to the orientation of that object or portion of the object in at least one degree of rotational freedom (up to six total degrees of freedom). As used herein, the term "shape" refers to a set of poses, positions, or orientations measured along an object.

As used herein, the term "operator" shall be understood to include any type of personnel who may be performing or assisting a procedure and, thus, is inclusive of a physician, a surgeon, a doctor, a nurse, a medical technician, other personnel or user of the technology disclosed herein, and any combination thereof. As used herein, the term "patient" should be considered to include human and/or non-human (e.g., animal) patients upon which a medical procedure is being performed.

FIG. 1 is a flow diagram illustrating a method 100 for performing a medical procedure in accordance with various embodiments of the present technology. The method 100 is illustrated as a set of steps or processes 110-170. All or a subset of the steps of the method 100 can by implemented by any suitable computing system or device, such as a control system of a medical instrument system or device (e.g., including various components or devices of a robotically-controlled or teleoperated surgical system), a workstation, a portable computing system (e.g., a laptop computer), any/or a combination thereof. In some embodiments, for example, the computing system for implementing the method 100 includes one or more processors operably coupled to a memory storing instructions that, when executed, cause the computing system to perform operations in accordance with the steps 110-170. Additionally or alternatively, all or a subset of the steps 110-170 of the method 100 can be executed at least in part by an operator (e.g., a physician, a user, etc.) of the computing system, and/or by a robotically-controlled surgical system via user inputs from the operator through a user input device or automatically through using closed loop control and/or pre-programmed instructions through a processor of the system. The method 100 is illustrated in the following description by cross-referencing various aspects of FIGS. 2A-7.

The method 100 begins at step 110 with positioning an elongate flexible device near a target site in an anatomic region of a patient. The anatomic region can be any portion of the patient's body that includes at least one target site to be treated (e.g., ablated). For example, the anatomic region can be or include an airway of the patient's lungs, and the target site can be a known or suspected tumor within or near the airway. In other embodiments, however, the method 100 can be performed in other anatomic regions and/or other types of target sites.

The elongate flexible device can be a flexible catheter or similar tool suitable for introduction into the anatomic region and to the target site via minimally invasive techniques. In some embodiments, the elongate flexible device, or at least a portion thereof (e.g., a distal portion), can be positioned and/or articulated via pull wires, cables, linkages, and/or other steering controls, as discussed further below with reference to FIGS. 12A and 12B. For example, the distal portion of the elongate flexible device may be articulated to a plurality of different poses and/or shapes (e.g., positions, orientations, bend angles, bend radii, bending planes or directions, etc.) during the medical procedure. The positioning and/or articulation of the elongate flexible device may be performed manually, the elongate flexible device may be robotically controlled by user control through an input device, or the elongate flexible device may be robotically controlled automatically using a pre-programmed set of instructions from a robotic system such as the robotic medical systems described in detail below with reference to FIG. 11.

Figure 2A:
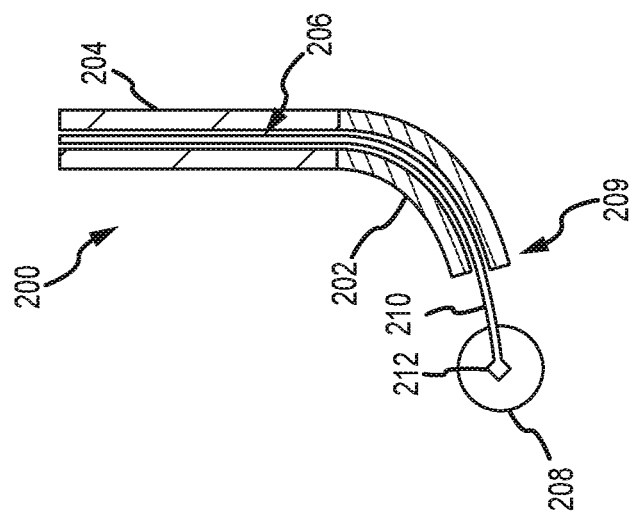
FIG. 2A is a partially schematic cross-sectional view of an elongate flexible device configured in accordance with various embodiments of the present technology.

FIG. 2A is a partially schematic cross-sectional view of an elongate flexible device 200 ("device 200") configured in accordance with various embodiments of the present technology. The device 200 includes a distal portion 202, a body portion 204 proximal to the distal portion 202, and a lumen or channel 206 extending through the distal portion 202 and the body portion 204. In some embodiments, the device 200 is introduced into the anatomic region by navigating the device 200 through passageways in the patient anatomy (not shown in FIG. 2A) until the distal portion 202 is at or near a target site 208 (e.g., within 0.25 cm, 0.5 cm, 1 cm, 1.5 cm, 2 cm, 2.5 cm, 3 cm, 3.5 cm, 4 cm, 4.5 cm, or 5 cm of the target site 208). The distal portion 202 can be oriented toward the target site 208, e.g., by adjusting the pose (e.g., position, orientation, bend angle, bend radius, bending plane) of the distal portion 202. As shown in FIG. 2A, when the distal portion 202 is oriented toward the target site 208, the longitudinal axis A of the distalmost end 209 of the device 200 can intersect, overlap, or otherwise be generally aligned with the target site.

Optionally, once the device 200 is positioned in the desired spatial relationship with respect to the target site 208, the pose of the device 200 or at least a portion thereof (e.g., the distal portion 202) can be locked, e.g., with respect to up to three degrees of translational freedom and/or up to three degrees of rotational freedom. The locked state can be achieved by controlling the amount of force and/or torque applied via the steering controls for the device 200 (not shown in FIG. 2A). In embodiments where the device 200 is controlled by pull wires, in one example, the amount of tension on the pull wires can be adjusted to lock the device 200 in a desired pose. In another example, the current pose of the device 200 can be measured using position sensors coupled to the device 200 or imaging data (as will be described below) and the current pose can be maintained by actively controlling the pull wires. The locking of the device 200 (or a portion thereof) can stabilize the device 200 and maintain the device 200 in the desired spatial configuration with respect to the target site 208 during subsequent procedures. For example, the locked state can allow various medical instruments and tools to be inserted into the lumen 206 to access the target site 208, as discussed in greater detail below.

Referring again to FIG. 1, in some embodiments, step 110 can also include obtaining image data of the elongate flexible device and/or surrounding anatomy, and positioning the elongate flexible device based on the image data. The image data can be obtained by an imaging device within the patient's body, an imaging device external to the patient's body, or a combination thereof. For example, the image data can be generated by an endoscopic camera or other image capture device carried within the lumen of the elongate flexible device, an intraoperative computed tomography (CT) imaging system, a fluoroscopic imaging system, an ultrasound device such as a radial endobronchial ultrasound (R-EBUS) device, or any other suitable imaging device. The operator can refer to such image data when navigating the elongate flexible device to the target site and/or when orienting the distal portion toward the target site. Optionally, if the images are obtained by an imaging device within the lumen of the elongate flexible device, the imaging device can be withdrawn from the lumen once the elongate flexible device is positioned and oriented properly. As discussed above, the elongate flexible device can be placed in a locked state during withdrawal of the imaging device to reduce or prevent inadvertent displacement of the elongate flexible device away from the target site. Additional details of representative processes for navigating an elongate flexible device to a target site are described in U.S. Patent App. Pub. No. 2017/0265952, filed Jul. 17, 2015, disclosing "Systems and Methods for Planning Multiple Interventional Procedures," which is incorporated by reference herein in its entirety.

At step 120, the method 100 continues with introducing a medical instrument to the target site via the elongate flexible device. The medical instrument can be any minimally invasive instrument or tool configured to be deployed into the anatomic region via the lumen of the elongate flexible device. For example, the medical instrument can be an energy delivery instrument suitable for use in, for example, surgical, diagnostic, therapeutic, ablative, and/or biopsy procedures. In such embodiments, the energy delivery instrument can be an ablation probe configured for tissue ablation, such as by transmitting electromagnetic waves to a target site to increase the temperature of tissue at or near the target site. The energy delivery instrument can include an antenna used to radiate energy (e.g., microwave energy) for use in the tissue ablation process. In some embodiments, for example, the antenna is used to create electromagnetic radiation within a wavelength range of one meter to one millimeter, and within a frequency range of approximately 300 MHz to 300 GHz (e.g., a microwave). A microwave, which is a type of radio wave, is made up of a magnetic field at a right angle to an electric field, and both the magnetic field and the electric field oscillate at a specific frequency and travel together along a direction that is perpendicular to both the magnetic field and the electric field. The wavelength and the frequency of the microwaves being radiated by the antenna may be modified to cause a desired type of ablation at the ablation target site. In other embodiments, however, the energy delivery instrument can use other types of ablation mechanisms (e.g., chemical ablation, thermal ablation, cryoablation, etc.). Moreover, the method 100 can be implemented with other types of medical instruments, such as biopsy tools (e.g., a biopsy needle), imaging probes, etc.

Figure 2B:
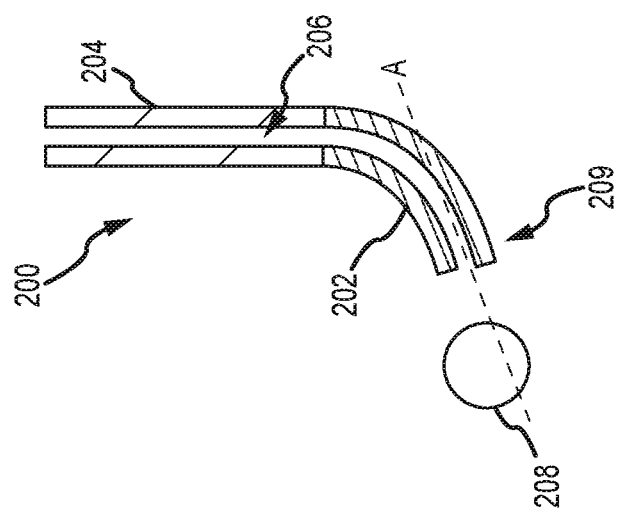
FIG. 2B is a partially schematic cross-sectional view of a medical instrument within the elongate flexible device of FIG. 2A.

FIG. 2B is a partially schematic cross-sectional view of a medical instrument 210 within the elongate flexible device 200 of FIG. 2A. After the elongate flexible device 200 has been positioned with the distal portion 202 oriented toward the target site 208, the medical instrument 210 can be inserted into the lumen 206 of the elongate flexible device 200 and advanced toward the distal portion 202 and target site 208. The medical instrument 210 can be deployed through the lumen 206 until a distal tip section 212 of the medical instrument 210 extends past the distal end 209 of the device 200 (e.g., by at least 1 mm, 2 mm, 3 mm, 4 mm, 5 mm, 1 cm, 1.5 cm, 2 cm, 2.5 cm, or 3 cm). Because the distal portion 202 of the device 200 is already oriented toward the target site 208 and, optionally, locked in place, the distal tip section 212 of the medical instrument 210 can easily be placed in a desired spatial configuration with respect to the target site 208. For example, as shown in FIG. 2B, the distal tip section 212 can be in contact with (e.g., at least partially within) the target site 208. In other embodiments, however, the distal tip section 212 of the medical instrument 210 can be spaced apart from the target site 208 by a desired distance (e.g., within 1 cm, 5 mm, 4 mm, 3 mm, 2 mm, or 1 mm of the target site 208).

Referring again to FIG. 1, the positioning of the medical instrument in step 120 may be performed manually, the medical instrument may be robotically controlled by user control through an input device, or the medical instrument may be robotically controlled automatically using a pre-programmed set of instructions from a robotic system. Optionally, the positioning of the medical instrument may be performed based on image data, similar to the processes described above with respect to step 110. For example, imaging may be performed to verify that the medical instrument is positioned properly with respect to the target site. If the desired positioning is not achieved (e.g., the medical instrument is off-target because the elongate flexible device is not sufficiently aligned with the target site), the medical instrument can be withdrawn, and step 110 can be repeated to reposition the elongate flexible device in the appropriate spatial relationship with the target site.

Optionally, step 120 can also include puncturing tissue with the medical instrument. For example, the distal tip section of the medical instrument (e.g., distal tip section 212 of FIG. 2B) can be used to puncture tissue (e.g., an airway wall) to reach a target site (e.g., a tumor or lesion outside the airway). In other embodiments, a separate puncturing device such as a needle (e.g., a 19-20 gauge needle with a 5 mm extension) can be used to make an initial puncture of the tissue. In such embodiments, the puncturing device can be deployed to the target site via the lumen of the elongate flexible device, and used to create an opening. Subsequently, the puncturing device can be removed, and the medical instrument can be inserted into the target site via the opening. Optionally, additional tools (e.g., a cannula, sheath, dilator, etc.) can be used to enlarge the size of the opening before the medical instrument is inserted. The positioning of the medical instrument can be confirmed through imaging (e.g., fluoroscopy). If the positioning is not satisfactory (e.g., because the opening is too small for the medical instrument), the medical instrument can be withdrawn, and the puncturing device reintroduced to the target site to enlarge the opening or create a new opening.

In some embodiments, step 120 further includes determining and/or detecting the type of elongate flexible device, whether the medical instrument is within the lumen of the elongate flexible device and/or what type of medical instrument is present. The presence and/or type of the elongate flexible device and/or medical instrument may affect the operational mode of the elongate flexible device. For example, if an ablative elongate flexible device or an ablative medical instrument is present, the system can be switched from applying a first retraction mode (e.g., a normal retraction mode) to a second retraction mode (e.g., an ablation or treatment retraction mode) when retracting the elongate flexible device, as discussed in greater detail below with respect to step 140. As another example, if a diagnostic flexible device is detected or an imaging medical instrument is present, the elongate flexible device can remain in the first retraction mode (e.g., the normal retraction mode). In some embodiments, the first retraction mode is the default or normal operational mode for the elongate flexible device, and the elongate flexible is switched to the second retraction mode if an appropriate medical instrument type is detected. Optionally, the control system (or other suitable system or device) can first detect whether a medical instrument is within the lumen of the elongate flexible device, and then select an appropriate operational mode based on the type of the medical instrument. The presence and/or type of the medical instrument within the elongate flexible device can be detected in a number of different ways. For example, the detection can be performed manually, e.g., the operator can provide user input indicating that the medical instrument is deployed within the elongate flexible device. Such input can include pressing a button (e.g., on a touchscreen or control console), tapping the button a certain number of times and/or for a particular duration, etc.

As another example, the detection can be performed automatically by a computing system (or other suitable system or device). For example, for detection of a type of elongate flexible device, a printed circuit board, microchip, or other identifier may be included in a proximal housing of the elongate flexible instrument that can be read by the system to identify the type of elongate flexible device during installation or setup. For detection of a type of medical instrument, in one example, the system can use a sensor to detect the presence and/or type of the medical instrument, such as a magnetic sensor, optical sensor, RFID sensor, etc. In such embodiments, at least a portion of the medical instrument (e.g., a proximal portion) can include a sensing target configured to be detected by the sensor, such as a coil (e.g., a magnetic coil), pattern (e.g., a plurality of magnetic coils arranged in a predetermined configuration), markings (e.g., optical marking), tag, and/or other property or component. The sensor can be located external to the patient's body, e.g., carried by an insertion stage, guide, or other component operably coupled to the proximal portion of the medical instrument. When the medical instrument is deployed within the elongate flexible device, the sensing target can be placed in proximity to the sensor, causing the sensor to generate a signal indicating that the medical instrument is present and/or the medical instrument type. Additional techniques for sensing a medical instrument are described in International Pub. No. WO 2020/014207, filed Jul. 9, 2019, disclosing "Systems for Sensing Presence of Medical Tools," which is incorporated by reference herein in its entirety. Optionally, the detection can be based, at least partly, on whether a functional component associated with the medical instrument has been powered on. For example, in embodiments where the medical instrument is an energy delivery instrument, the presence of the energy delivery instrument can be determined based on whether a signal generator for the energy delivery instrument (e.g., an ablation generator) has been turned on.

At step 130, the method 100 includes determining a pose of a distal portion of the elongate flexible device. The pose can include the position, orientation, bend angle, bend radius, bending plane or direction, etc. of the distal portion, or a specific location or sub-section thereof. Any reference herein to "the pose of the distal portion" may also refer to the pose of a specific location of the distal portion (e.g., the distal end), a set of poses of a plurality of individual locations of the distal portion (e.g., a plurality of points distributed along the length of the distal portion), and/or the overall pose or shape of the entire distal portion. The pose can be determined in a number of different ways. In some embodiments, for example, the elongate flexible device includes or is otherwise associated with at least one sensor system configured to generate pose data or other sensor data, as discussed in greater detail below with respect to FIGS. 12A and 12B. For example, the sensor system can be or include one or more position sensors, orientation sensors, pose sensors, shape sensors, etc. As another example, the pose can also be determined based on control inputs for the elongate flexible device (e.g., inputs for the steering controls). In a further example, the pose can also be determined based on image data from an external imaging device (e.g., a fluoroscopic imaging system).

The pose of the distal portion may be automatically determined and tracked by a computing system (or other suitable system or device). The system can use the pose data to automatically or semi-automatically adjust the pose of the distal portion in subsequent process steps, as discussed further below. The pose data can also be output to an operator (e.g., via a suitable graphical user interface) so the operator can monitor and/or adjust the pose of the distal portion, as discussed in greater detail below.

At optional step 135, the pointing direction of the elongate flexible device can be altered a slight amount to overcome friction between the elongate flexible device and the medical instrument. In some embodiments, increasing the bend in the elongate flexible device or opening up the pointing direction (i.e., straightening the elongate flexible device) of the elongate flexible device a slight angle (e.g., 1 degree, 2 degrees, 3 degrees, etc.) may help alleviate friction while not significantly altering the orientation toward the target site. Accordingly, in one embodiment, the system may receive a user input via an input device, such as a button, switch, etc. to alter the pointing angle of the elongate flexible device a pre-determined small angular distance. The user may continue to provide additional input(s) until the user is satisfied the friction has been overcome. For example, the user can depress an input button multiple times to continue to alter the pointing direction of the elongate flexible device such that the pointing angle is altered the pre-determined distance each time the button is depressed. In other embodiments, the input device can be used to slowly alter the pointing orientation of the elongate flexible member until the user is satisfied. For example, a button can be depressed and held down by the user, and the system will slowly alter the angle until the user is satisfied. In still further embodiments, the user may hit the input device (e.g., depress the button) and the elongate flexible device will slowly decrease in rigidity (as will be described in more detail below), which can open up the angle of the elongate flexible device pointing direction since the elongate flexible device will tend to straighten out in a relaxed state reducing friction between the medical instrument and the elongate flexible device in the same way actively opening up the pointing direction of the elongate flexible device can reduce friction.

At step 140, the method 100 includes retracting the elongate flexible device away from the target site and/or relative to the medical instrument. The retracting process can involve withdrawing the elongate flexible device in a proximal direction so the distal portion of the elongate flexible device moves away from the target site. During retraction, the medical instrument can slide within the lumen of the elongate flexible device so that the distal tip section of the medical instrument remains within or at the target site while the distal portion of the elongate flexible device is withdrawn from the distal tip section of the medical instrument. For example, in embodiments where the medical instrument is an energy delivery instrument, the elongate flexible device can be retracted to partially or fully expose a portion of the energy delivery instrument used for radiating energy (e.g., an antenna). As previously discussed, retraction can reduce or avoid interference with energy delivery to tissue, and can also reduce or avoid damage to the elongate flexible device.

The elongate flexible device can be retracted any suitable distance, such as a distance (e.g., an incremental or total retraction distance) of at least 1 mm, 2 mm, 3 mm, 4 mm, 5 mm, 1 cm, 1.5 cm, 2 cm, 2.5 cm, 3 cm, 3.5 cm, 4 cm, 4.5 cm, 5 cm, or more. The retraction distance can be a defined distance that is measured from the target site, from the distal tip section of the medical instrument, and/or from the initial position of the elongate flexible device. In some embodiments, the retraction distance is configured so that the exposed length of the medical instrument after retraction is at least 5 mm, 1 cm, 1.5 cm, 2 cm, 2.5 cm, 3 cm, 3.5 cm, 4 cm, 4.5 cm, 5 cm, or more. The retraction of the elongate flexible device may be performed manually, the elongate flexible device may be robotically retracted by user control through an input device, or the elongate flexible device may be robotically retracted automatically using a pre-programmed set of instructions from a robotic system, as discussed in greater detail below. For example, the retraction can be effectuated by a control system including one or more actuators operably coupled to the proximal portion of the elongate flexible device. Optionally, the elongate flexible device can be subjected to one or more movement constraints during retraction, as described in greater detail below.

Optionally, step 140 also includes confirming whether the elongate flexible device has been successfully retracted. In some situations, for example, the distal portion of the elongate flexible device may catch on tissue or a portion of the elongate flexible device may buckle (e.g., if the local anatomy is narrow and/or tortuous) or may otherwise fail to retract properly, even if the input controls show that retraction has occurred. Accordingly, the positioning of the elongate flexible device can be analyzed to verify whether the distal portion has in fact been retracted, using pose data (e.g., from a shape sensor), image data (e.g., live fluoroscopy), or any other suitable sensor data. If the positioning is not satisfactory, the retraction process can be repeated until the elongate flexible device has been successfully retracted by the desired distance.

In some embodiments, step 140 further includes performing the retraction of the elongate flexible device according to a retraction mode or other operational mode. The retraction mode can control various parameters of the elongate flexible device during the retraction process, such as the degree of rigidity and a threshold for altering the degree of rigidity (e.g., a retraction velocity threshold, a retraction distance threshold). As previously discussed with reference to step 120, the applied retraction mode may depend on the type of elongate flexible device, whether a medical instrument is present within the lumen of the elongate flexible device and/or the type of medical instrument present. For example, the retraction mode can include: (a) a first retraction mode when a first type of elongate flexible device is detected (e.g., a diagnostic catheter) and/or there is no medical instrument present or a first type of medical instrument is present (e.g., an imaging device) (also referred to herein as a "normal retraction mode"), and (b) a second retraction mode when a second type of elongate flexible device (e.g., a treatment or ablation catheter) and/or a second type of medical instrument is present (e.g., a treatment instrument such as an energy delivery instrument) (also referred to herein as a "treatment retraction mode" or "ablation retraction mode"). In some embodiments, the normal retraction mode is configured for situations where the elongate flexible device is withdrawn during the course of normal navigation (e.g., to move the elongate flexible device to a different part of the anatomy or remove the elongate flexible device from patient anatomy at the conclusion or at an intermediate step of a medical procedure). The normal retraction mode can also be used in situations where an energy delivery instrument or other treatment instrument is present but not yet positioned at a target site. The treatment retraction mode can be configured for situations where the treatment instrument is positioned at a target site and the elongate flexible device is being retracted to expose a portion of a treatment instrument (e.g., before applying energy or other treatment via the instrument). Alternatively or in combination, the normal retraction mode can be configured for situations where the elongate flexible device is retracted by a relatively large distance (e.g., at least 5 cm), while the treatment retraction mode can be configured for situations where the elongate flexible device is retracted by a relatively small distance (e.g., less than 5 cm). For example, the normal retraction mode can be used in situations where the elongate flexible device is being removed from the patient anatomy.

The retraction mode can specify a threshold (e.g., a velocity threshold, distance threshold, etc.) for automatically transitioning the elongate flexible device from a relatively rigid, stiff, locked state to a relatively flexible, passive state (or vice-versa). As discussed above, the elongate flexible device or a portion thereof (e.g., the distal portion) can be placed into the locked or rigid state to maintain a particular pose with respect to the target site, e.g., while the medical instrument is introduced into the lumen of the elongate flexible device. However, the increased rigidity of the elongate flexible device in the locked state may cause tissue damage during retraction. For example, if the distal portion is locked into a curved or hooked shape, the "hook" may catch on, scrape against or otherwise damage tissue. Thus, during retraction, the elongate flexible device can be automatically switched into a passive state in which the stiffness of the elongate flexible device is reduced. In some examples, a desired passive state provides for partial rigidity/flexibility. For example, if the elongate flexible device requires repositioning and a small retraction to reposition at a new location, it can be time consuming and disruptive to reduce the rigidity to a fully flexible state, then immediately restore rigidity for insertion. Thus, the desired passive state can include a partial rigidity/flexibility. The passive state may be achieved, for example, by reducing the amount of force and/or torque applied to the steering controls for the elongate flexible device (e.g., reducing the tension on the pull wires). In some embodiments, the passive state is achieved by slowly reducing the tension on the pull wires until a desired flexibility is achieved. In other embodiments, the tension on the pull wires is incrementally decreased until a desired flexibility is achieved.

However, when the elongate flexible device is switched from the locked state to the passive state, the pose of the elongate flexible device may change (e.g., the distal portion may tend to straighten and/or conform to the local anatomy), which can shift the positioning of the medical instrument. Thus, to reduce the likelihood of inadvertently displacing the medical instrument from the target site, the treatment retraction mode can have a higher velocity threshold for automatically switching from the locked state to the passive state, compared to the normal retraction mode. In some embodiments, for example, the velocity threshold for the treatment retraction mode is greater than or equal to 20 mm/s, 25 mm/s, 30 mm/s, 35 mm/s, 40 mm/s, 45 mm/s, or 50 mm/s; and the velocity threshold for the normal retraction mode is less than or equal to 30 mm/s, 25 mm/s, 20 mm/s, 15 mm/s, 10 mm/s, or 5 mm/s.

Accordingly, in some embodiments, step 140 includes switching from a normal retraction mode to a treatment retraction mode, and retracting the elongate flexible device based on the parameters of the treatment retraction mode. The system can automatically switch between the normal retraction mode and treatment retraction mode upon detecting that that the medical instrument is within the lumen of the elongate flexible device and/or determining the type of the medical instrument (e.g., as discussed above with respect to step 120). Alternatively or in combination, the operator can switch between modes by providing user input via a user input device, e.g., pressing a button, entering a predetermined sequence of button presses, etc. Additional examples of operational modes for an elongate flexible device and input controls for switching between modes are disclosed in U.S. Patent App. Pub. No. 2019/0231449, filed Jun. 30, 2017, disclosing "Systems and Methods for Flexible Computer-Assisted Instrument Control"; International Pub. No. WO 2019/027922, filed Jul. 30, 2018, disclosing "Systems and Methods for Safe Operation of a Device"; and International Pub. No. WO 2020/072415, filed Oct. 1, 2019, disclosing "Systems and Methods for Control of Steerable Devices"; which are incorporated by reference herein in their entireties.

At step 150, the method 100 continues with adjusting the distal portion of the elongate flexible device to orient the distal portion toward the target site. For example, after the retraction process of step 140, the distal portion of the elongate flexible device may be offset from, oriented away from, or otherwise insufficiently aligned with the target site. Consequently, the medical instrument may have become misaligned with and/or displaced from the target site. Accordingly, step 150 can include adjusting (e.g., articulating) the distal portion of the elongate flexible device to reorient it—and thus, the medical instrument—back toward the target site. The adjustment can include changing a pose of the distal portion, such as the position, orientation, bend angle, bend radius, and/or bending plane. For example, the adjustment can include any of the following: increasing or decreasing the bend angle, increasing or decreasing the bend radius, translating the distal portion with respect to up to three degrees of freedom, rotating the distal portion with respect to up to three degrees of freedom, changing a direction of the bending plane, or a combination thereof. The direction and magnitude of the adjustment can be configured to reposition the medical instrument or a portion thereof back in the desired spatial relationship with respect to the target site (e.g., at least partially within the target site).

FIGS. 3A-3C, for example, are partially schematic cross-sectional views of an elongate flexible device 300 ("device 300") during a retraction and adjustment procedure in accordance with various embodiments of the present technology. The device 300 can be identical or generally similar to the device 200 of FIGS. 2A and 2B. For example, referring first to FIG. 3A, the device 300 includes a distal portion 302, a body portion 304, and a lumen 306. Before retraction, the device 300 can be in an initial pose with the distal portion 302 oriented toward a target site 308. A medical instrument 310 (e.g., an ablation probe or other energy delivery instrument) can be positioned within the lumen 306, with its distal tip section 312 positioned at least partially within the target site 308. In the illustrated embodiment, the distal portion 302 of the device 300 has an initial bend angle $\theta_1$, e.g., as measured between the longitudinal axis A of the distalmost end of the distal portion 302 and the longitudinal axis B of the body portion 304 (axis B). For example, the initial bend angle $\theta_1$ can be less than or equal to 90°, 80°, 70°, 60°, 50°, 45°, 40°, 30°, 20°, 15°, 10°, or 5°.

Referring next to FIG. 3B, the device 300 can be withdrawn along a retraction direction R 1 away from the target site 308. As a result, the device 300 and medical instrument 310 are moved proximally away from the target site 308. As shown in FIG. 3B, after retraction, the distal portion 302 is no longer oriented toward the target site 308 and the distal tip section 312 of the medical instrument 310 is displaced from the target site 308.

Referring next to FIG. 3C, the device 300 can be adjusted to reorient the distal portion 302 back towards the target site 308. In the illustrated embodiment, the adjustment includes articulating the distal portion 302 along a direction $D_1$ to change the bend angle of the distal portion 302 from the initial bend angle $\theta_1$ to an adjusted bend angle $\theta_2$. The adjusted bend angle $\theta_2$ can be smaller than the initial bend angle $\theta_1$, such that the adjusted shape of the distal portion 302 is straighter and less curved than the initial shape (FIG. 3A), also referred to herein as "opening" or "relaxing" the bend angle. As shown in FIG. 3C, after the adjustment, the distal portion 302 is reoriented toward the target site 308 and the distal tip section 312 of the medical instrument 310 is repositioned within the target site 308.

Figure 4C:
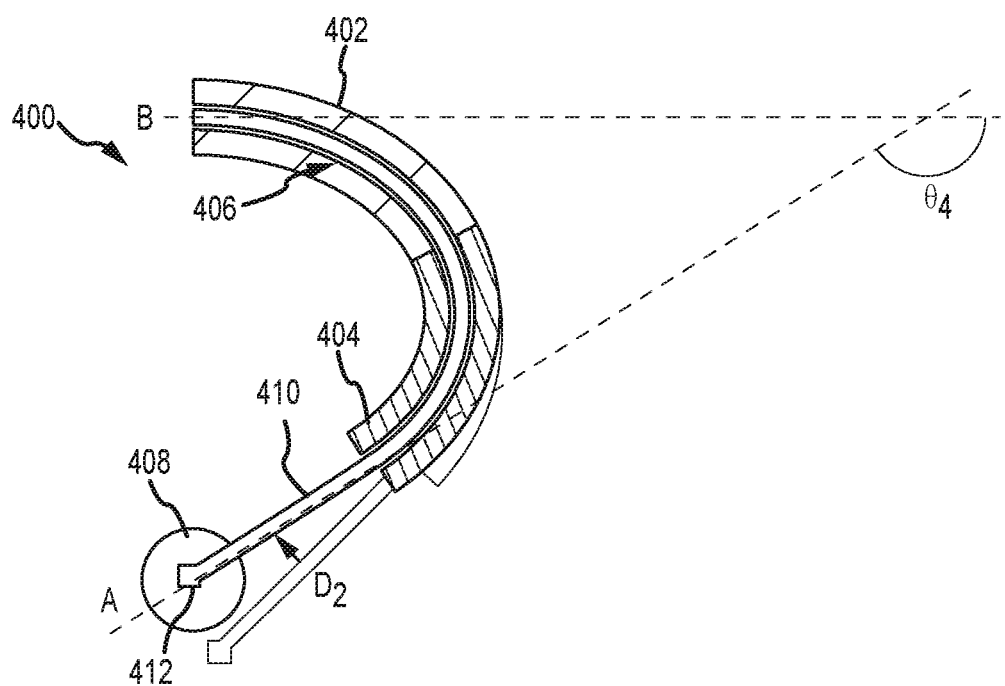

FIGS. 4A-4C are partially schematic cross-sectional views of an elongate flexible device 400 ("device 400") during another retraction and adjustment procedure in accordance with various embodiments of the present technology. The device 400 can be generally similar to the devices 200 and 300 of FIGS. 2A-2B and 3A-3C, respectively. For example, referring first to FIG. 4A, the device 400 includes a distal portion 402, a body portion 404, and a lumen 406. Before retraction, the device 400 can be in an initial pose with the distal portion 402 oriented toward a target site 408. A medical instrument 410 can be positioned within the lumen 406, with its distal tip section 412 positioned at least partially within the target site 408. In the illustrated embodiment, the distal portion 402 of the device 400 has an initial bend angle $\theta_3$, e.g., as measured between the longitudinal axis A of the distal end of the distal portion 402 and the longitudinal axis B of the body portion 404 (axis B). For example, the initial bend angle $\theta_3$ can be greater than or equal to 90°, 110°, 120°, 130°, 135°, 140°, 150°, 160°, 170°, or 180°.

Referring next to FIG. 4B, the device 400 can be withdrawn along a retraction direction $R_2$ away from the target site 408, thus moving the device 400 and medical instrument 410 proximally away from the target site 408. As shown in FIG. 4B, after retraction, the distal portion 402 is oriented away from the target site 408 and the distal tip section 412 of the medical instrument 410 is displaced from the target site 408.

Referring next to FIG. 4C, the device 400 can be adjusted to reorient the distal portion 402 back towards the target site 408. In the illustrated embodiment, the adjustment includes articulating the distal portion 402 from the initial bend angle $\theta_3$ to an adjusted bend angle $\theta_4$ along a direction $D_2$. The adjusted bend angle $\theta_4$ can be larger than the initial bend angle $\theta_3$, such that the adjusted shape of the distal portion 402 is more curved than the initial shape (FIG. 4A), also referred to herein as "closing" or "tightening" the bend angle. As shown in FIG. 4C, after the adjustment, the distal portion 402 is reoriented toward the target site 408 and the distal tip section 412 of the medical instrument 410 is repositioned within the target site 408.

Referring again to FIG. 1, the adjustment process of step 150 can be performed in a number of different ways. For example, the adjustment of the elongate flexible device may be performed manually, the elongate flexible device may be robotically adjusted by user control through an input device, or the elongate flexible device may be robotically adjusted automatically using a pre-programmed set of instructions from a robotic system, as discussed in greater detail below. In some embodiments, the adjustment is effectuated by a control system including one or more actuators operably coupled to the proximal portion of the elongate flexible device. Optionally, the elongate flexible device can be subjected to one or more movement constraints during the adjustment process, as described in greater detail below.

The adjustment to the elongate flexible device can be determined in many different ways. In some embodiments, for example, the adjustment to the elongate flexible device is based, at least in part, on pose data. As previously discussed with respect to step 130, the pose of the distal portion of the elongate flexible device can be tracked throughout the retraction and/or adjustment procedures, e.g., using sensor data, image data from an external imaging device, input controls, etc. The pose data can be used to determine the current pose of the distal portion after retraction and calculate an adjusted pose that would realign the distal portion with the target site. For example, step 150 can include using the current pose data after retraction to determine a difference between a current bend angle of the distal portion and an adjusted bend angle that would reorient the distal portion toward the target site, and articulating the distal portion from the current bend angle to the adjusted bend angle (e.g., as previously discussed with respect to FIGS. 3A-4C). As another example, step 150 can include comparing the current pose of the distal portion after retraction to a previous pose before retraction to determine the adjusted pose, and then adjust by moving the distal portion at least partially back to the previous pose.

In some embodiments, step 150 includes measuring an initial pose of the distal portion before retraction, predicting how the pose would change when the elongate flexible device is retracted, and adjusting the pose to compensate for the predicted change before, during, and/or after retraction. In some embodiments, the pose of the elongate flexible device during and/or after retraction is predicted based on one or more of the following parameters: the initial pose before retraction, properties of the elongate flexible device (e.g., stiffness), the desired retraction distance, the shape of the local anatomy (e.g., based on image data and/or an anatomic model), or any suitable combination thereof. For example, the prediction can assume that the elongate flexible device will be pulled back by the desired retraction distance, with the pose after retraction remaining the same or substantially the same as the initial pose. As another example, if the elongate flexible device is likely to come into contact with tissue surface (s) during retraction, the prediction can calculate how the pose of the elongate flexible device would change, e.g., based on the stiffness of the elongate flexible device and a model of the local anatomy. The predicted pose can be used to determine an adjusted pose (e.g., an adjusted position, orientation, bend angle) to keep the elongate flexible device oriented toward the target site during and/or after retraction.

Alternatively or in combination, step 150 can include identifying the location of the target site and determining the adjustment based on the identified location. The location of the target site can be identified based on image data, such as images from an intraoperative CT imaging system, a fluoroscopic imaging system, an ultrasound device such as a R-EBUS device, an endoscopic camera, and/or any other suitable imaging device. In such embodiments, the location can be determined by an operator (e.g., by identifying the location in image data via a graphical user interface, confirming that the distal portion is pointed at the target site, etc.), automatically by the system, or a combination thereof. In other embodiments, however, the location of the target site can be determined without relying on image data of the target site, e.g., based on the pose of the distal portion of the elongate flexible device before retraction determined, for example, during step 130. In one example, the location of the target site can be assumed to be a set position and/or orientation relative to the pose of the distal portion before the elongate flexible device is retracted. As another example, the location of the target site can be determined based on a projection (e.g., a projected distance) from the distal portion of the elongate flexible device before retraction. The location data can be used to determine an adjustment to the pose of the distal portion to keep the distal portion oriented toward the target site. For example, the location data can be used to compute a change in bend angle, position, orientation, etc., to keep the distal portion generally aligned with the target site.

The retraction process of step 140 and the adjustment process of step 150 can be performed in a number of different ways. In some embodiments, for example, step 140 and step 150 are performed sequentially. For example, the method 100 can include first retracting the elongate flexible device, then adjusting the distal portion of the elongate flexible device (e.g., as previously discussed with respect to FIGS. 3A-3C and 4A-4C). In other embodiments, however, steps 140 and 150 can be performed simultaneously, e.g., the distal portion can be adjusted while the elongate flexible device is retracted. In such embodiments, the distal portion can be continuously adjusted during retraction so the distal portion remains oriented toward the target site through the entire process and the medical instrument is maintained in the proper position with respect to the target site.

Additionally, as shown by decision step 155, in some embodiments, optional step 135, step 140, and step 150 are repeated multiple times to retract and adjust the elongate flexible device over a series of incremental movements, also referred to herein as "iterative retraction." In such an iterative retraction process, step 140 can include retracting the elongate flexible device by an incremental distance that is less than the total retraction distance, and step 150 can include making an incremental adjustment to the distal portion. This procedure can be repeated multiple times (e.g., at least 5, 10, 20, 30, 40, or 50 times) until the elongate flexible device has been retracted by the total retraction distance. Optionally, as noted above, after step 150 has been performed to make an incremental adjustment, step 135 may be performed to reduce friction between the elongate medical device and the medical instrument prior to repeating the retraction step 140 to move the elongate flexible device by the incremental distance. The magnitude of each incremental retraction distance can be based on various factors, such as the shape of the local anatomy (e.g., amount of curvature of the airways), known or expected friction between the elongate flexible device and the medical instrument, total retraction distance desired (e.g., 1%, 5%, 10%, 20%, 25%, 30%, 35%, 40%, 45%, or 50% of the total distance), retraction direction, etc. For example, the incremental distance can be less than or equal to 1 mm, 2 mm, 3 mm, 4 mm, 5 mm, 6 mm, 7 mm, 8 mm, 9 mm, or 10 mm. The incremental distance can be the same for some or all of the retraction steps, or can be different for some or all of the retraction steps. In some embodiments, the rigidity of the elongate flexible device may be incrementally decreased during each incremental retraction distance until a desired flexibility is achieved. In other embodiments, the rigidity of the elongate device may be slowly reduced over the incremental retraction distance until a desired flexibility is achieved. The iterative retraction techniques described herein can be used to reduce or break the friction between the medical instrument and the lumen of the elongate flexible device, thus allowing the elongate flexible device to be withdrawn with little or no shifting of the medical instrument.

At step 160, the method 100 optionally includes checking the positioning of the medical instrument with respect to the target site. This verification can be performed by imaging the medical instrument and patient anatomy (e.g., using fluoroscopy or a cone beam CT (CBCT) imaging system or other imaging device). Subsequently the image data can be analyzed to determine whether the medical instrument is still positioned properly with respect to the target site (e.g., whether the distal tip section remains at least partially within the target site). If the positioning is not satisfactory, the medical instrument can be repositioned by repeating some or all of the previous steps of the method 100. For example, some or all of steps 130, 135, 140, and/or 150 can be repeated to adjust the elongate flexible device, if proper positioning can be achieved with relatively small corrections. However, if significant corrections are needed, the method 100 can restart at step 110 to reposition the elongate flexible device relative to the target site. In such embodiments, the medical instrument can optionally be withdrawn from the elongate flexible device so that an endoscopic camera (or other suitable imaging device) can be deployed into the lumen of the elongate flexible device to facilitate repositioning.

At step 170, the method 100 includes treating the target site with the medical instrument. For example, in embodiments where the medical instrument is an energy delivery instrument (e.g., an ablation probe), step 170 can include applying energy with the energy delivery instrument to ablate tissue at the target site (e.g., a tumor or lesion). Once ablation is complete (e.g., once the tumor/lesion and tissue margins have been adequately ablated as confirmed by sensor feedback such as impedance, temperature, imaging, etc., and/or once a pre-determined period of time has elapsed), ablation energy delivery can be terminated. In other embodiments, however, the medical instrument can be used to apply other types of therapies besides tissue ablation. Once the treatment process of step 170 is complete, the medical instrument may be withdrawn from the elongate flexible device and/or removed from the patient anatomy. If multiple target sites are to be treated, the method 100 can restart at step 110 to position the elongate flexible device at the next site, and can be repeated until all sites have been treated.

Although the steps of the method 100 are discussed and illustrated in a particular order, the method 100 illustrated in FIG. 1 is not so limited. In other embodiments, the method 100 can be performed in a different order. In these and other embodiments, any of the steps of the method 100 can be performed before, during, and/or after any of the other steps of the method 100. For example, as discussed above, step 140 can be performed before, during, and/or after step 150. Additionally, step 130 can be performed before, during, and/or after one or both of steps 140 and 150; and step 160 can be performed before, during, and/or after any of steps 130, 140, and/or 150. Moreover, a person of ordinary skill in the relevant art will recognize that the illustrated method 100 can be altered and still remain within these and other embodiments of the present technology. For example, one or more steps of the method 100 illustrated in FIG. 1 can be omitted (e.g., steps 130 and/or 160). Additionally, one or more steps of the method 100 can be repeated, as previously described.

Any of the steps of the method 100 can be performed based on input from an operator (e.g., via a robotically-controlled system), automatically by a computing system (or any other suitable system or device), or by a suitable combination thereof. For example, Table 1 provides representative control schemes for the retraction process (step 140) and adjustment process (step 150) of the method 100. As shown in Table 1, depending on the control scheme, the retraction and adjustment processes can be performed automatically by a computing system, performed based on input from an operator, or a combination thereof. For control schemes involving operator inputs, the operator inputs can be provided to a robotic control system (e.g., a teleoperated medical system discussed below with reference to FIGS. 11-12B), and the robotic control system can actuate retraction and/or adjustment of the elongate flexible device based on the operator inputs. Each of the control schemes in Table 1 is described in detail below.

TABLE 1

Representative Control Schemes for
Retraction and Adjustment Processes

| Control scheme | Retraction performed by: | Adjustment performed by: |
| --- | --- | --- |
| Automatic | System | System |
| Semi-automatic | Operator input | System |
| Semi-automatic | System | Operator input |
| Constrained operator control | Operator input (constrained by system) | Operator input (constrained by system) |
| Full operator control | Operator input | Operator input |

In an "automatic" control scheme, the retraction and adjustment processes can both be performed automatically by a computing system (or any or suitable system or device).

Under the automatic control scheme, the system generates the signals for controlling the retraction and adjustment processes, e.g., using closed loop control and/or pre-programmed instructions. The operator can initiate the procedure by providing a single button user command or other suitable input signal. Subsequently, the system can automatically retract the elongate flexible device, and can simultaneously or sequentially adjust the pose of the distal portion to keep the medical instrument at or near the target site. In some embodiments, the system automatically tracks the pose of the distal portion and/or the location of the target site, and can use the tracked pose and/or location to automatically calculate the appropriate adjustments, as previously discussed with respect to step 130 of the method 100.

As described above, the system can retract the elongate flexible device in a single step, or can iteratively retract the elongate flexible device over a series of incremental steps. In embodiments where the system iteratively retracts the elongate flexible device, the user can optionally trigger each incremental retraction and adjustment step by inputting a single button user command (or other suitable signal). For example, the user can input a first command to initiate an incremental retraction, input a second command to initiate an incremental adjustment, input the first command again to initiate the next incremental retraction, and so on. Alternatively, the system can perform the iterative retraction procedure without awaiting user input before each retraction and adjustment step. The system can automatically retract the elongate flexible device until the desired total retraction distance is achieved, or until the operator issues a command to pause or stop retraction.

A "semi-automatic" control scheme can involve control by both operator input and the system, e.g., certain processes are controlled based on input from the operator and other processes are automatically controlled by the system. In some embodiments, for example, a semi-automatic control scheme can include retraction based on operator inputs (e.g., step 140 is performed based on input signals from input devices controlled by the operator) and automatic adjustment by the system (e.g., step 150 is performed based on automated signals from the system). For instance, the operator can control the retraction the elongate flexible device by providing control signals to the system via an input device (e.g., a scroll wheel, trackball, etc.). The system can automatically adjust the distal portion of the elongate flexible device during and/or after retraction, e.g., based on pose and/or location data as discussed above. In some embodiments, although the system automatically controls the direction and magnitude of the adjustments, the operator controls the timing of the adjustments. For example, the operator can provide a command (e.g., pressing a button) to trigger the automatic adjustment at any point during and/or after the retraction process. Optionally, the operator can also pause or stop the automatic adjustment at any point (e.g., by releasing the button). In other embodiments, however, once the operator has triggered the automatic adjustment, the system performs the adjustment to completion regardless of user input.

In a further example, a semi-automatic control scheme can include automatic retraction by the system (e.g., step 140 is performed based on automated signals from the system) and adjustment based on operator input (e.g., step 150 is performed based on input signals from input devices controlled by the operator). In such embodiments, the system can automatically retract the elongate flexible device (e.g., iteratively or in a single continuous motion), and the operator can provide input signals to adjust the distal portion of the elongate flexible device during and/or after the retraction (e.g., based on fluoroscopy data or other image data). For example, the operator can directly control the pose (e.g., position, orientation, bend angle, bend radius, bending plane, etc.) of the distal portion using buttons, scroll wheels, or other suitable user input devices. As another example, the operator can input a first command (e.g., pressing and holding a button) that causes the system to increase or decrease the bend angle of the distal portion at a specified velocity (e.g., 0.5°/s, 1°/s, 2°/s, 3°/s, 4°/s, or 5°/s). Once the operator determines that the distal portion has reached the desired bend angle, the operator can input a second command (e.g., releasing the button) to stop the adjustment.

A "constrained operator control" control scheme can involve retraction and adjustments based on inputs from the operator, but the movement of the elongate flexible device during one or both of these steps is subject to constraints imposed automatically by the system. For example, the retraction and/or adjustment processes described herein can be performed while the distal portion of the elongate flexible device is constrained to a specified movement range. The movement range can be configured to keep the distal portion generally aligned with the target site. For example, the movement range can specify a range of permitted positions, orientations, bend angles, bending directions, etc. for the distal portion. The constrained movement range can be presented to the operator via a suitable user interface to provide guidance during retraction and/or adjustment, as discussed in greater detail below. The constrained operator control scheme can prevent the elongate flexible device from being moved too far out of alignment with the target site, which is expected to make the retraction and/or adjustment procedures easier for the operator to perform. Optionally, the system can adjust the sensitivity of the input devices (e.g., operator inputs produce finer, more precise movements) to assist the operator in controlling the elongate flexible device. In some examples, the sensitivity can be reduced to zero or substantially zero so that the elongate flexible device may not move even with movement of the input device.

Figure 5:
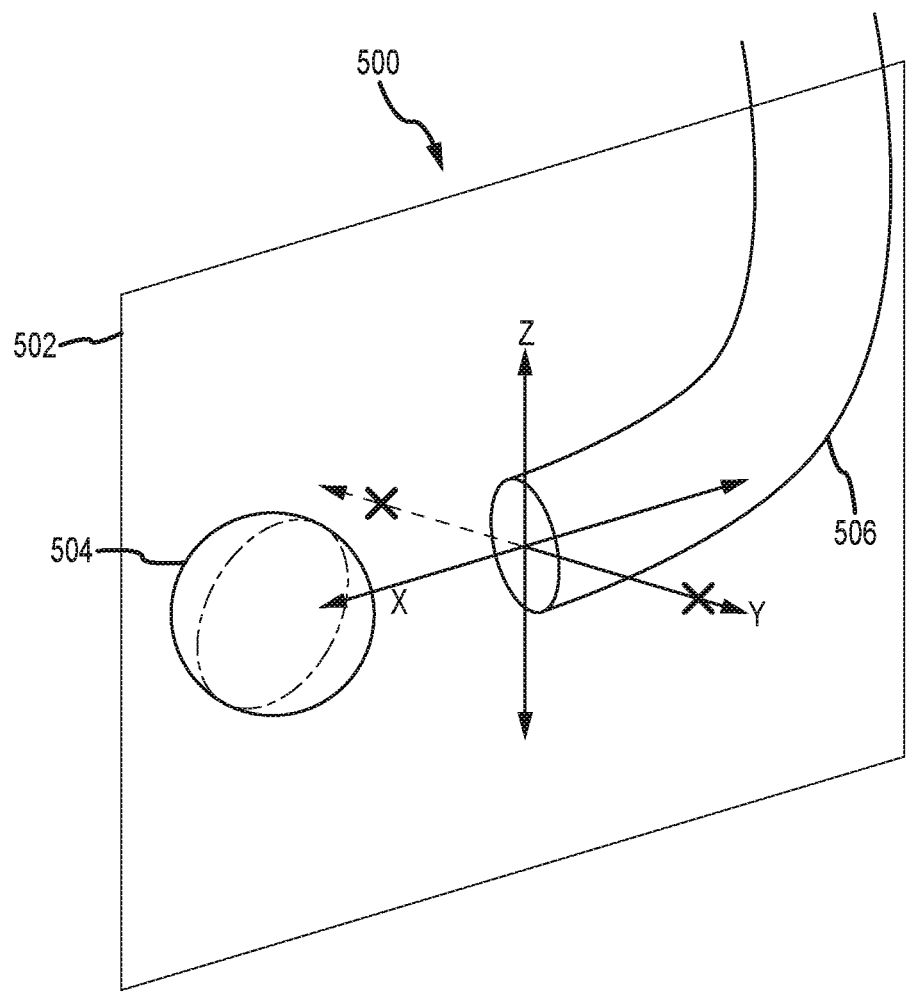
FIG. 5 is a schematic illustration of an elongate flexible device that is constrained to a movement plane in accordance with various embodiments of the present technology.

FIG. 5 is a schematic illustration of an elongate flexible device 500 ("device 500") that is constrained to a movement plane 502 in accordance with various embodiments of the present technology. The movement plane 502 can be aligned with a target site 504. For example, the movement plane 502 can intersect and/or at least partially overlap a portion of the target site 504 (e.g., the center and/or central portion of the target site 504). In some embodiments, the movement plane 502 corresponds to the initial bending plane of the distal portion 506 of the device 500 before retraction, assuming that the distal portion 506 is already aligned with the target site 504 at this stage of the process. Optionally, the location of the movement plane 502 may be determined based on other parameters, such as the location of the target site 504, the shape of the local anatomy, the particular direction and/or angle the device 500 takes to reach to the target site, etc. During retraction and/or adjustment, the distal portion 506 can be constrained to move only along directions within and/or overlapping the movement plane 502. For example, as shown in FIG. 5, the distal portion 506 can move in the x- and z-directions lying in the movement plane 502, but cannot move in the y-direction orthogonal to the movement plane 502. As another example, the distal portion 506 can articulate (e.g., bend) along directions within the movement plane 502, but cannot articulate along directions lying outside the movement plane 502. In some examples, sensitivity of the input device may be reduced to zero in one or more planes other than the movement plane 502 to provide movement within the movement plane 502.

Figure 6:
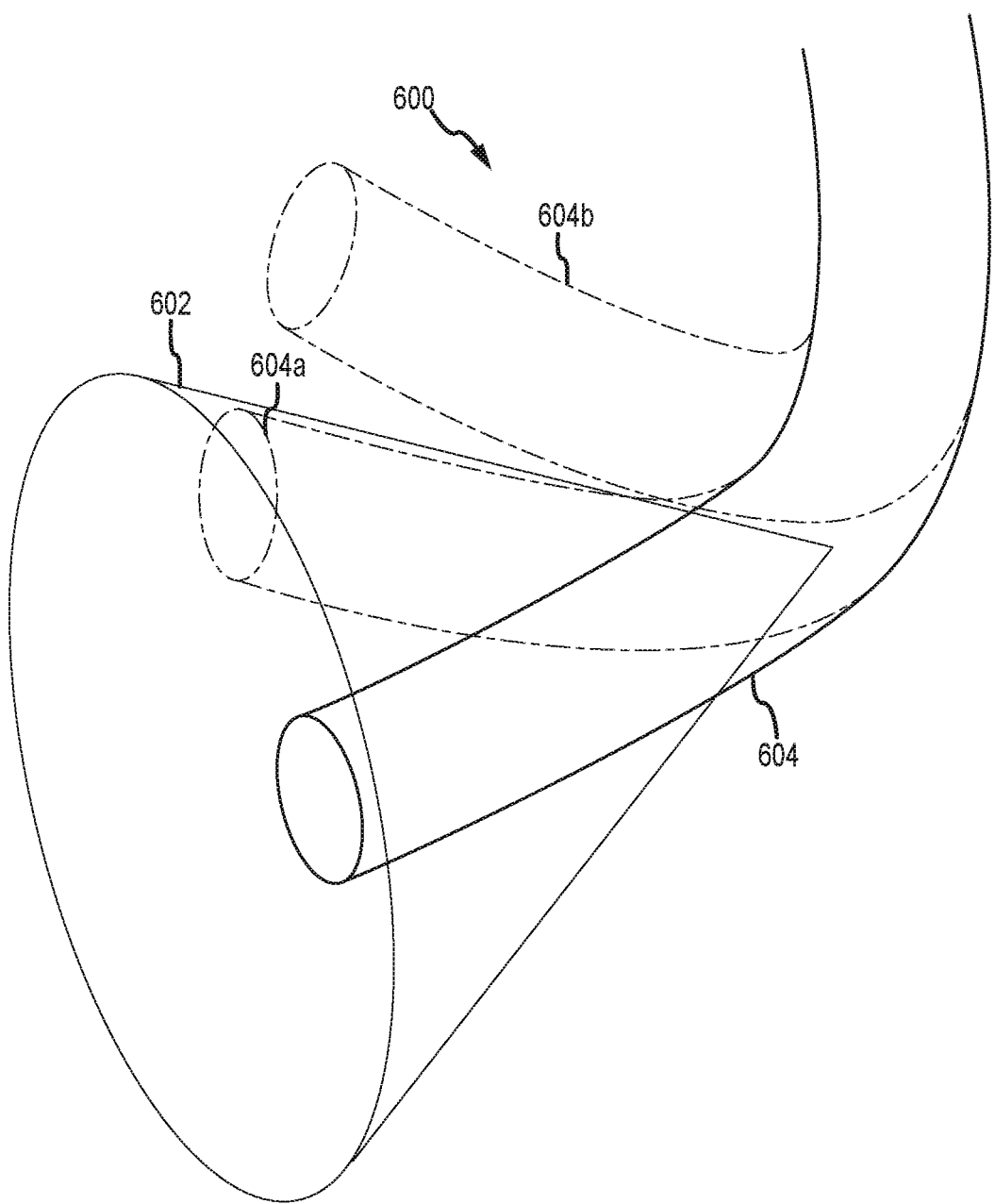
FIG. 6 is a schematic illustration of an elongate flexible device constrained to a range of bend angles in accordance with various embodiments of the present technology.

FIG. 6 is a schematic illustration of an elongate flexible device 600 ("device 600") that is constrained to a range of bend angles 602 ("range 602") in accordance with various embodiments of the present technology. The range 602 can be a two- or three-dimensional shape or region (e.g., a conical shape) representing the set of bend angles for which the distal portion 604 remains generally aligned with a target site (not shown). For example, the range 602 can intersect and/or at least partially overlap a portion of the target site (e.g., the center or central portion of the target site). The size of the range 602 can be varied as desired, e.g., based on the size of the target site, the distance between the distal portion 604 and the target site, and/or the desired extent of operator control. In some embodiments, for example, the range 602 can span no more than 1°, 2°, 3°, 4°, 5°, 6°, 7°, 8°, 9°, 10°, 15°, 20°, or 30° of bending motion. As can be seen in FIG. 6, the distal portion 604 is permitted to articulate freely within the range 602 (e.g., to pose 604a), but cannot articulate to bend angles that would cause some or all of the distal portion 604 to exceed the boundaries of the range 602 (e.g., to pose 604b).

Figure 7:
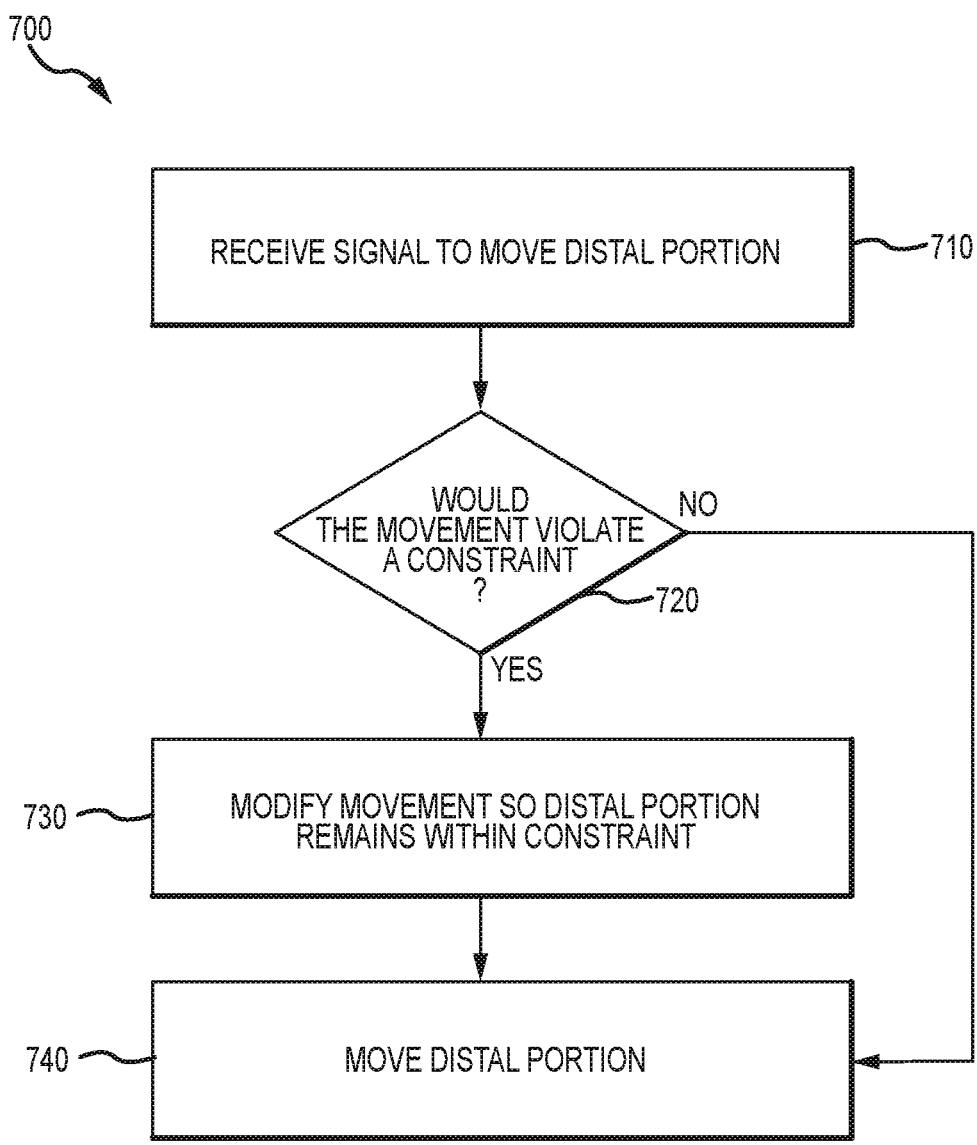
FIG. 7 is a flow diagram illustrating a method for controlling movement of an elongate flexible device in accordance with various embodiments of the present technology.

FIG. 7 is a flow diagram illustrating a method 700 for controlling movement of an elongate flexible device in accordance with various embodiments of the present technology. The method 700 is illustrated as a set of steps or processes 710-740. All or a subset of the steps of the method 700 can by implemented by any suitable computing system or device, such as a control system of a medical instrument system or device, a workstation, a portable computing system, any/or a combination thereof. In some embodiments, the computing system for implementing the method 700 includes one or more processors operably coupled to a memory storing instructions that, when executed, cause the computing system to perform operations in accordance with the steps 710-740. The method 700 may be performed as part of a constrained operator control scheme in connection with the method 100 of FIG. 1 (e.g., as a sub-process of steps 140 and/or 150).

The method 700 begins at step 710 with receiving a signal to move the distal portion of the elongate flexible device. The signal can be received from a user input device (e.g., a scroll wheel, trackball, etc.), and can indicate an operator-commanded movement (e.g., translation, rotation, change in bend angle or radius, change in bending plane, etc.). Examples of input devices suitable for use for controlling movement of an elongate flexible device are described in International Pub. No. WO 2019/027922, filed Jul. 30, 2018, disclosing "Systems and Methods for Safe Operation of a Device," which is incorporated by reference herein in its entirety. The signal can indicate a desired retraction movement, a desired adjustment movement, or a combination thereof.

At step 720, the system determines whether the movement would violate at least one movement constraint. For example, the system can predict how the distal portion would move in response to the operator-commanded movement, and can evaluate whether the new pose of the distal portion would violate a movement constraint (e.g., lie partially or entirely outside a movement plane, exceed a range of permissible bend angles, etc.). If so, at step 730, the system can modify the commanded movement so the distal portion remains within the boundaries specified by the movement constraint. For example, the system can reduce the magnitude of the commanded movement, change a direction of the commanded movement, etc. Optionally, the system can alert the operator that the commanded movement would violate a movement constraint, e.g., via textual notifications, graphics, audio, haptic feedback, etc. The operator may have the option to override the movement constraint, e.g., by pressing a button or other input commands. At step 740, the system moves the distal portion of the elongate flexible device, either according to the original commanded movement (if the movement does not violate any movement constraint) or according to the modified movement (if modifications were made).

In a "full operator control" control scheme, the operator can control both the retraction and adjustments processes via inputs to the system, with optional guidance from the system. As discussed in greater detail below, the system can display a graphical user interface to assist the operator in retracting and adjusting the elongate flexible device, but otherwise does not constrain or otherwise control the movements of the elongate flexible device. The operator can retract and adjust the elongate flexible device by providing control signals to the system via a suitable input device. For example, during the retraction process, the operator can directly control the retraction and/or adjustments via a scrollwheel or other input device. As another example, during the adjustment process, the operator can control the articulation of distal portion by inputting a first command (e.g., pressing and holding a button) to cause the system to change the bend angle at a specified velocity, and inputting a second command (e.g., releasing the button) to stop the adjustment once the desired bend angle is reached.

The techniques described herein (e.g., the method 100 of FIG. 1) can performed using one or more of the control schemes. In some embodiments, a single control scheme is used throughout the entire procedure. In other embodiments, however, multiple control schemes can be used at different stages in the procedure. The control scheme to be used may be selected by the operator, determined automatically by the system, or any suitable combination thereof. The selected control scheme may vary based on the parameters for the particular medical procedure, such as the location of the target site, size of the target site, tissue structure and/or tissue density of the target site (which may affect the likelihood of the medical instrument becoming dislodged during retraction), local anatomy (e.g., shape of the passageways near the target site), the type of medical instrument, the amount of retraction desired, operator skill level, and/or operator preference.

In any of the control schemes described herein (e.g., automatic, semi-automatic, constrained operator control, full operator control), the system can include a display configured to output a user interface for providing guidance to the operator. The user interface can be a graphical user interface configured to allow the operator to monitor the elongate flexible device, medical instrument, and/or target site during the retraction and adjustment processes. Optionally, if appropriate, the graphical user interface can output instructions, feedback, indicators, alerts, etc., to guide the operator in retracting and/or adjusting the elongate flexible device (e.g., for the semi-automatic, constrained operator control, and/or full operator control schemes). For example, the graphical user interface can display image data of an anatomic region including the target site, elongate flexible device, and/or medical instrument so the operator can track the locations of these elements with the patient's body. The image data can be obtained from an external imaging system (e.g., fluoroscopy, CT), an internal imaging system (e.g., an endoscopic camera), or a combination thereof.

The graphical user interface can include one or more indicators or annotations to guide the operator in retracting and adjusting the elongate flexible device. The indicators can include visual indicators, audible indicator, haptic indicators, or any suitable combination thereof. The visual indicators can be or include any suitable graphical element, such as markers, symbols, shapes, highlighting, coloring, patterning, textual instructions, etc. The audible and/or haptic indicators can provide feedback to the operator during retraction and/or adjustment, e.g., when retraction is initiated, when retraction is terminated, when the elongate flexible device is on target, when the elongate flexible device is off target, etc.

In some embodiments, for example, the graphical user interface includes a first indicator representing the location of the target site. The first indicator can be a first visual indicator that is overlaid onto the image data of the anatomy, and can indicate the boundaries and/or center of the target site. The graphical user interface can also include at least one second indicator configured to guide an operator in adjusting the distal portion of the elongate flexible device to remain oriented toward the target site. For example, the second indicator(s) can identify a target movement range for the distal portion, such as target movement plane, target range of bend angles, etc. As another example, the second visual indicator(s) can depict a target pose (e.g., position, orientation, bend angle, etc.) for the distal portion. In yet another example, the second indicator(s) can be visual indicator(s) that graphically represent an adjustment to the distal portion to orient the distal portion toward the target site (e.g., an adjustment to the position, orientation, bend angle, bending plane, etc.).

Alternatively or in combination, the graphical user interface can include a first indicator representing a current pose of the distal portion of the elongate flexible device. The current pose can be determined based on data from a sensor system, as previously described. The first indicator can be, for example, a first visual indicator that is overlaid onto image data of the patient's anatomy (e.g., a live fluoroscopic image) or can be displayed separately from or without images of the anatomy. The graphical user interface can include at least one second indicator corresponding to a target movement range for adjusting the distal portion of the elongate flexible device to remain oriented toward the target site during retraction. As discussed further below, the target movement range can be or include a range of bend angles, a target movement plane, and/or an adjusted position and orientation for the distal portion of the elongate flexible. In some embodiments, the second indicator is a visual indicator, such as an overlay onto image data of the anatomic region or other graphical element. Optionally, the second indicator can be an audible and/or haptic indicator, such as a sound or vibration that occurs when the elongate flexible device is moved outside of the target movement range.

Optionally, for the constrained operator control scheme, the graphical user interface can also include one or more third indicator representing the movement constraint(s) imposed by the system. The graphical user interface can also display other instructions, notifications, alerts, etc., to assist the operator. For example, the graphical user interface can track the retraction distance of the elongate flexible device, and can notify the operator when the measured distance exceeds the target retraction distance. The graphical user interface can be updated as the elongate flexible device is moved (e.g., retracted and/or adjusted) to provide real-time or near-real-time image-based guidance.

Figure 8:
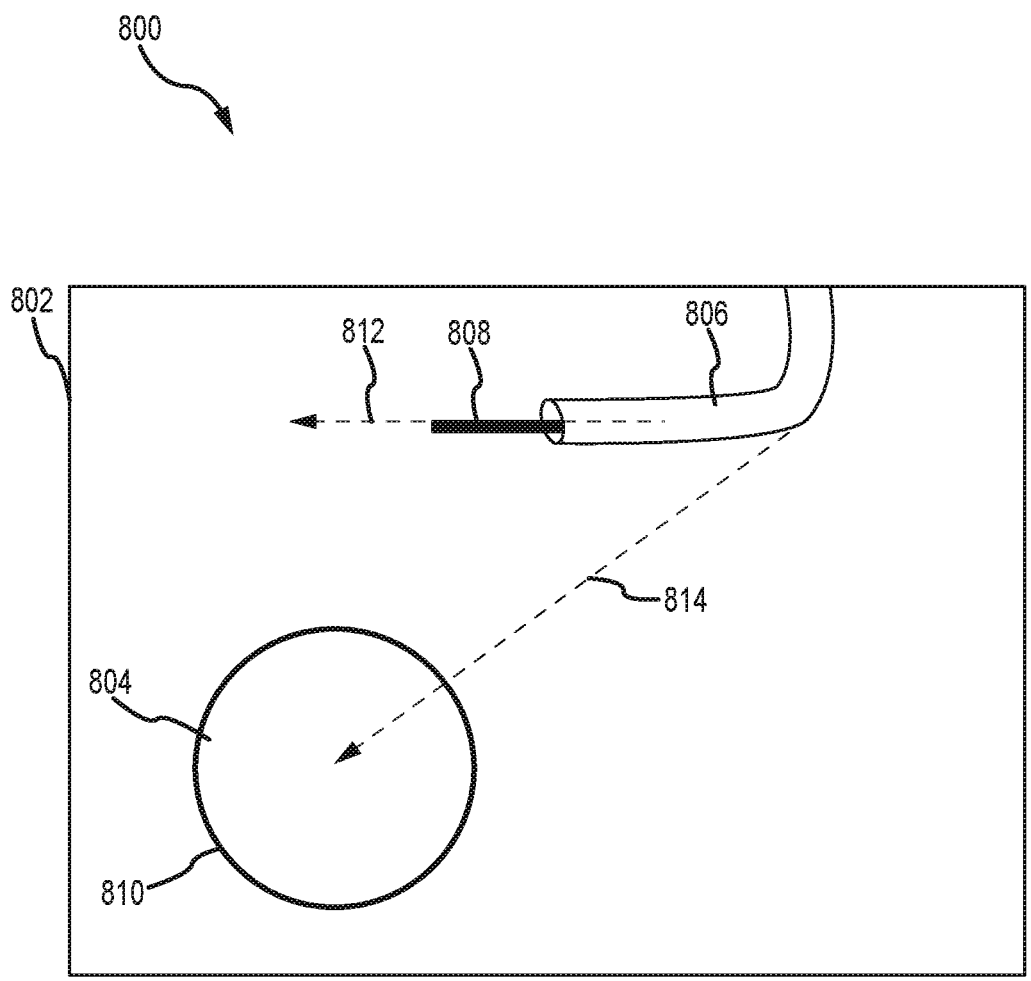
FIG. 8 illustrates a graphical user interface for a medical procedure configured in accordance with various embodiments of the present technology.

FIG. 8 illustrates a graphical user interface 800 ("interface 800") for a medical procedure configured in accordance with various embodiments of the present technology. The interface 800 can include an image 802 of the patient anatomy, and can show a target site 804, an elongate flexible device 806, and a medical instrument 808 carried by the elongate flexible device 806. For example, the image 802 can be a real-time fluoroscopic image or video allowing the operator to continuously track the location and pose of the elongate flexible device 806 and/or medical instrument 808 relative to the target site 804. Given the construction of the elongate flexible device 806 and medical instrument 808, each can be easily visible in the real-time fluoroscopic image. In some examples, a snapshot of the elongate flexible device 806 and medical instrument 808 can be captured and overlaid on a live fluoroscopic image as a reference showing a target trajectory of the medical instrument 808 after the elongate flexible device 806 has been retracted. In some examples, the user can additionally or alternatively mark a distal point of the elongate flexible device 806 an/or medical instrument 808 on the fluoroscopic image using a touchscreen to provide guidance for a target position of a distal end point of the medical instrument 808 after retraction of the elongate flexible device 806.

The interface 800 can include a first visual indicator 810 identifying the location of the target site 804, such as an outline or boundary surrounding at least a portion of the target site 804. In some embodiments, the target site 804 may be poorly visible or not visible in the image 802, such that the first visual indicator 810 helps the operator track the location of the target site 804. The interface 800 can also include at least one second visual indicator guiding the operator to orient the elongate flexible device 806 toward the target site 804. In the illustrated embodiment, the second visual indicators include a first arrow or vector 812 representing a current orientation of the elongate flexible device 806 and a second arrow or vector 814 representing a target alignment of the elongate flexible device 806. In some examples, the vector 814 can be determined based on the target trajectory or target end point position established using the real-time fluoroscopic images of the elongate flexible device 806 and the medical instrument 808 described above. Accordingly, the operator can easily visualize the adjustments to the elongate flexible device 806 to place the medical instrument 808 in contact with the target site 804.

Figure 9:
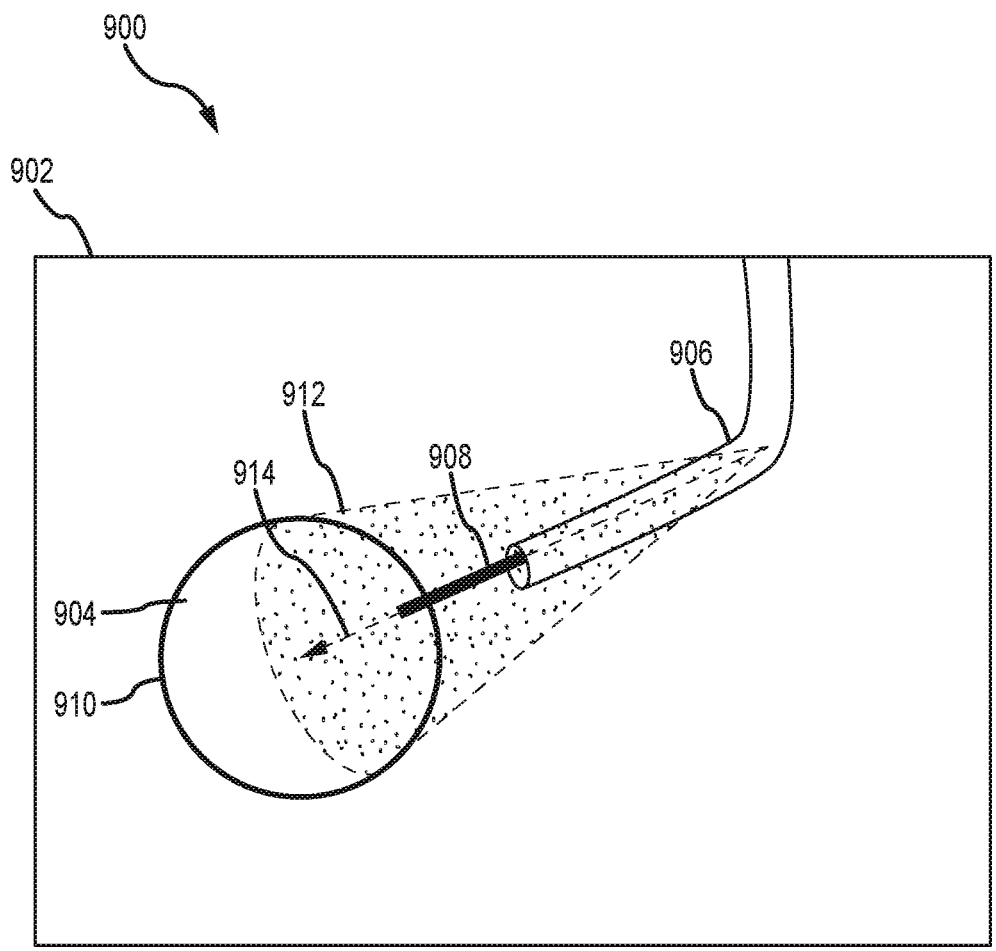
FIG. 9 illustrates another graphical user interface for a medical procedure configured in accordance with various embodiments of the present technology.

FIG. 9 illustrates another graphical user interface 900 ("interface 900") for a medical procedure configured in accordance with various embodiments of the present technology. The interface 900 can be generally similar to the interface 800 of FIG. 8. For example, the interface 900 includes an image 902 displaying a target site 904, an elongate flexible device 906, and a medical instrument 908. The image 902 can be a real-time fluoroscopic image, CBCT image, or video allowing the operator to continuously track the location and pose of the elongate flexible device 906 and/or medical instrument 908 relative to the target site 904. The interface 900 can also include a first visual indicator 910 identifying the location of the target site 904 (e.g., an outline). The interface 900 can also include one or more second visual indicators depicting a target movement range to keep the elongate flexible device 906 oriented toward the target site 904. In the illustrated embodiment, the second visual indicators include a highlighted, colored, and/or patterned region 912 indicating a range of bend angles for the elongate flexible device 906. The second visual indicators can also include an arrow or vector 914 representing a current bend angle or orientation of the elongate flexible device 906.

Figure 10:
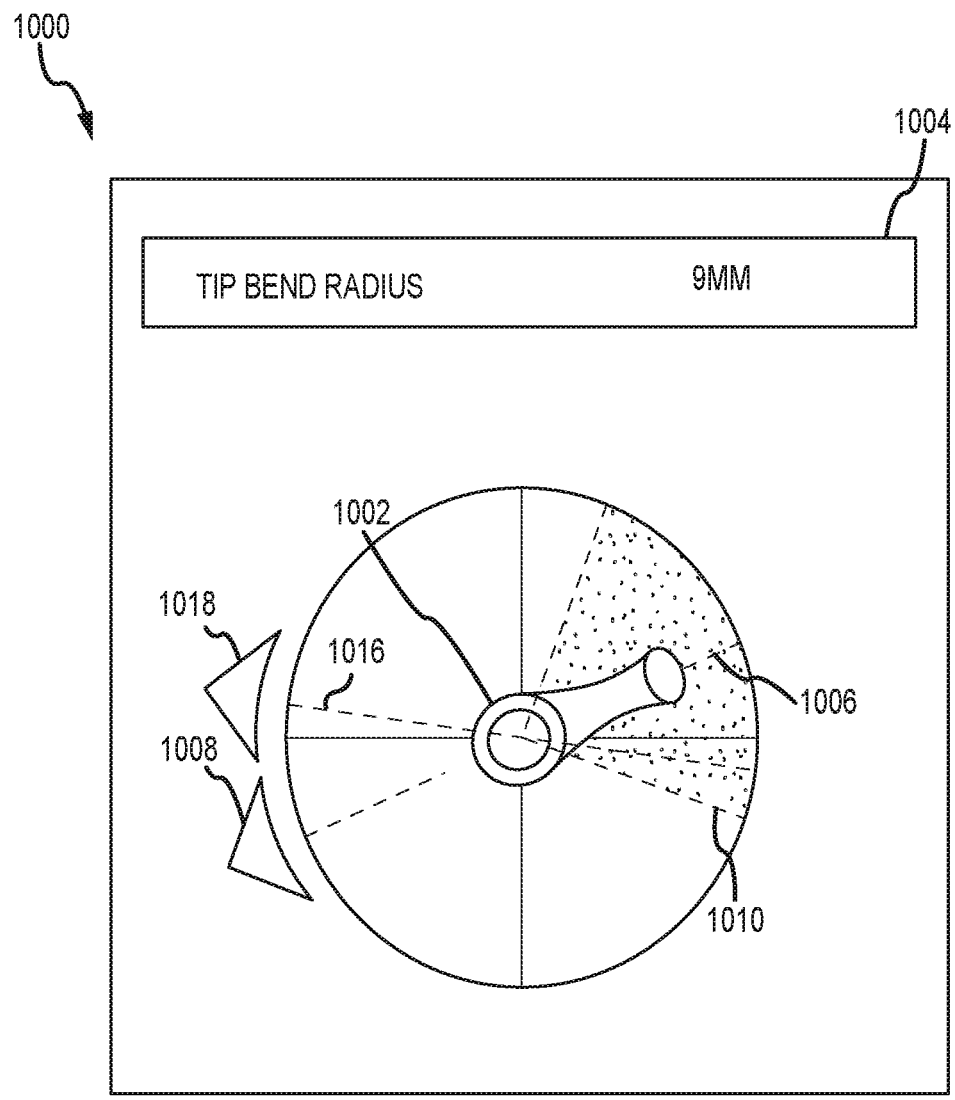
FIG. 10 illustrates yet another graphical user interface for a medical procedure configured in accordance with various embodiments of the present technology.

FIG. 10 illustrates yet another graphical user interface 1000 ("interface 1000") for a medical procedure configured in accordance with various embodiments of the present technology. The interface 1000 can include a graphical representation 1002 of the distal portion of the elongate flexible device depicting the current shape (e.g., bend angle) of the distal portion. The interface 1000 can optionally include an output field 1004 quantifying the shape of the distal portion (e.g., in terms of bend radius). The interface 1000 can also depict the current bending plane of the distal portion, e.g., via the orientation of the graphical representation 1002 and/or one or more directional indicators (e.g., line element 1006, arrow 1008) representing the direction of the bending plane. As shown in FIG. 10, the bending plane can intersect and/or at least partially overlap the longitudinal axis of the distal portion and can represent the overall directionality of the distal portion.

In the illustrated embodiment, the interface 1000 does not directly depict the location of the target site. However, the interface 1000 can still guide the operator by providing at least one visual indicator showing a target movement range to keep the distal portion oriented toward the target site. For example, as shown in FIG. 10, the interface 1000 can include a region 1010 indicating a target range of directions for the bending plane of the distal portion. The target range can be any suitable size, e.g., spanning no more than 1°, 2°, 3°, 4°, 5°, 6°, 7°, 8°, 9°, 10°, 20°, or 30°. As another example, the interface 1000 can include a second line element 1016 and/or a second arrow 1018 representing a target plane for the distal portion (e.g., the plane that intersects and/or is aligned with the target site). Additionally or alternatively, if the distal portion is locked to a particular movement plane, the interface 100 can include a visual indicator representing the constrained movement plane (not shown), such as a movement plane overlapping the target site as previously discussed with reference to FIG. 5.

Although certain embodiments of the systems and methods herein are described in connection with using the elongate flexible device to control the positioning of the medical instrument, in other embodiments, the medical instrument itself may be controlled independently of the elongated flexible device. For example, the medical instrument may be controlled manually, the medical instrument may be robotically controlled by user control through an input device, or the medical instrument may be robotically controlled automatically using a pre-programmed set of instructions from a robotic system. As such, the medical instrument can be controlled in combination with, or as an alternative to, the elongate flexible device to maintain the proper positioning of the medical instrument with respect to a target site.

In some embodiments, for example, the position and/or orientation of the medical instrument can be controlled during the retraction and/or adjustment of the elongate flexible device (e.g., during steps 140 and/or 150 of FIG. 1). For example, the medical instrument can be actively advanced toward the target site and relative to the elongate flexible device before, during, and/or after retracting the elongate flexible device. The medical instrument can be moved distally by an advancement distance that may be greater than, equal to, or less than the retraction distance of the elongate flexible device. Optionally, if the elongate flexible device is being withdrawn via an iterative retraction process, the medical instrument can also be incrementally advanced before, during, and/or after each incremental retraction step. This approach can reduce the total retraction distance of the elongate flexible device and can further facilitate proper positioning of the medical instrument.

As another example, the medical instrument can be affixed or otherwise stabilized to a stationary component to hold the position of the medical instrument during retraction. For instance, the proximal portion of the medical instrument can be mechanically coupled to an insertion stage, instrument carriage, and/or other element suitable for stabilizing the medical instrument. In yet another example, the medical instrument can be actively moved (e.g., by vibrating, dithering, back-and-forth motions, etc.) to reduce or break up friction between the medical instrument and the elongate flexible device, which is expected to reduce the effects of the retraction motion on the positioning of the medical instrument. In such embodiments, the system can include one or more sensors to detect the amount of friction between the medical instrument and the elongate flexible device, such as one or more force sensors at the proximal portions of the medical instrument and elongate flexible device (e.g., at or near the instrument carriage, insertion stage, etc.), at the distal portions of the medical instrument and elongate flexible device (e.g., within the lumen of the elongate flexible device), and/or any other suitable location. If the detected friction exceeds a threshold value, the medical instrument and/or elongate flexible device can be moved to break the friction.

Additionally, the medical instrument can include various sensors configured to track the positioning of the medical instrument, e.g., with respect to the elongate flexible device and/or target site. For example, the medical instrument can include positional sensors, shape sensors, and/or other sensors configured to generate pose data for the medical instrument or a portion thereof (e.g., the distal tip section of the medical instrument). As another example, the medical instrument can include sensors configured to detect whether the medical instrument is in contact with the target site, such as force sensors, impedance sensors, etc. Optionally, if the medical instrument is an energy delivery instrument, the energy deliver instrument can include sensors configured to measure reflected power to determine whether the medical instrument is still in contact with the target site.

Figure 11:
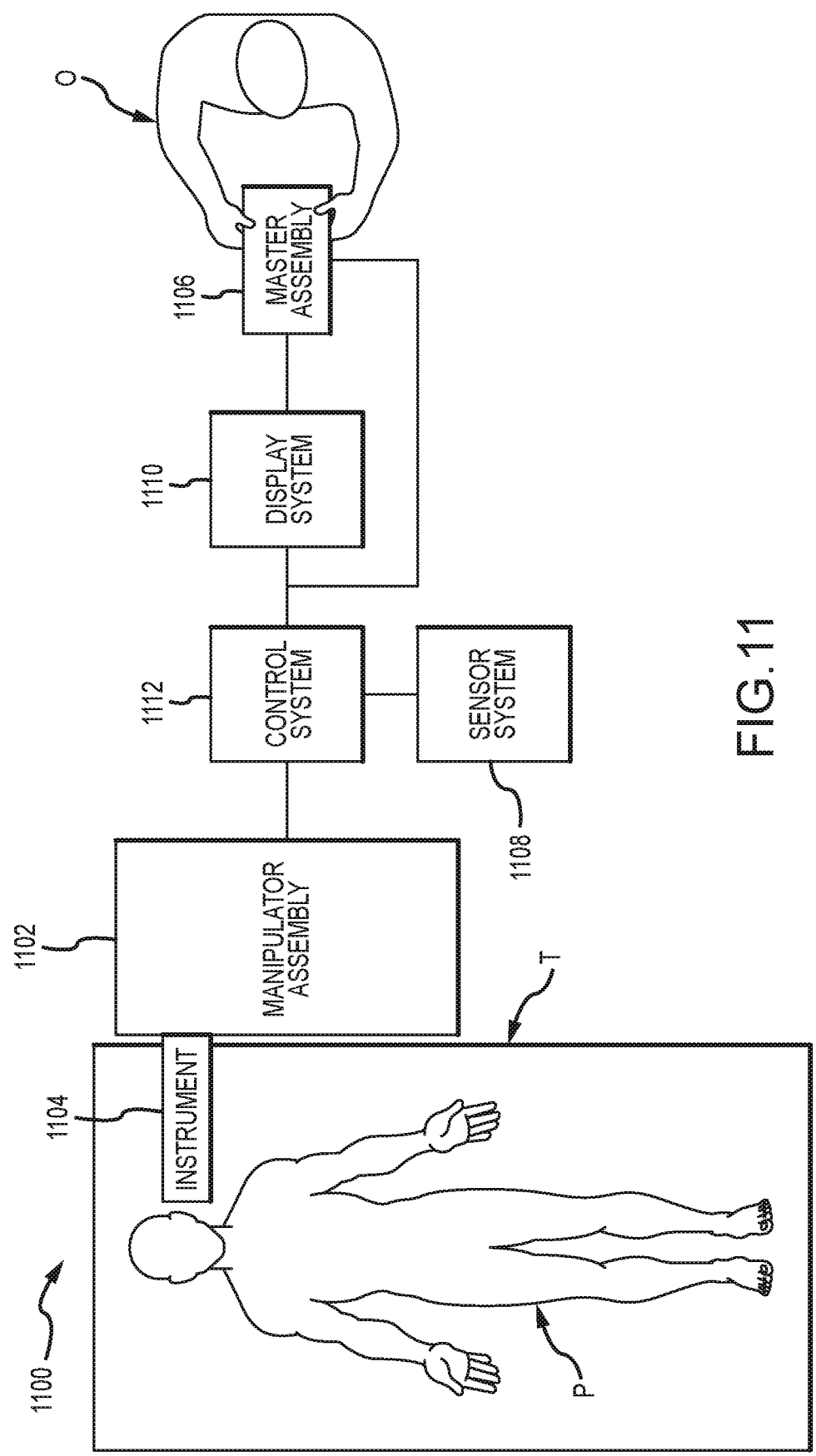
FIG. 11 is a simplified diagram of a teleoperated medical system configured in accordance with various embodiments of the present technology.

FIG. 11 is a simplified diagram of a teleoperated medical system 1100 ("medical system 1100") configured in accordance with various embodiments of the present technology. The medical system 1100 can be used to perform any of the processes described herein in connection with FIGS. 1-10. For example, the medical system 1100 can be used to perform a medical procedure involving retracting and adjusting an elongate flexible device, as previously discussed in connection with the method 100 of FIG. 1.

In some embodiments, the medical system 1100 may be suitable for use in, for example, surgical, diagnostic, therapeutic, or biopsy procedures. While some embodiments are provided herein with respect to such procedures, any reference to medical or surgical instruments and medical or surgical methods is non-limiting. The systems, instruments, and methods described herein may be used for animals, human cadavers, animal cadavers, portions of human or animal anatomy, non-surgical diagnosis, as well as for industrial systems and general robotic or teleoperational systems.

As shown in FIG. 11, the medical system 1100 generally includes a manipulator assembly 1102 for operating a medical instrument 1104 in performing various procedures on a patient P positioned on a table T. In some embodiments, the medical instrument 1104 may include, deliver, couple to, and/or control any of the flexible instruments described herein. The manipulator assembly 1102 may be teleoperated, non-teleoperated, or a hybrid teleoperated and non-teleoperated assembly with select degrees of freedom of motion that may be motorized and/or teleoperated and select degrees of freedom of motion that may be non-motorized and/or non-teleoperated.

The medical system 1100 further includes a master assembly 1106 having one or more control devices for controlling the manipulator assembly 1102. The manipulator assembly 1102 supports the medical instrument 1104 and may optionally include a plurality of actuators or motors that drive inputs on the medical instrument 1104 in response to commands from a control system 1112. The actuators may optionally include drive systems that when coupled to the medical instrument 1104 may advance the medical instrument 1104 into a naturally or surgically created anatomic orifice. Other drive systems may move the distal end of the medical instrument 1104 in multiple degrees of freedom, which may include three degrees of linear motion (e.g., linear motion along the X, Y, and Z Cartesian axes) and in three degrees of rotational motion (e.g., rotation about the X, Y, and Z Cartesian axes). Additionally, the actuators can be used to actuate an articulable end effector of the medical instrument 1104 for grasping tissue in the jaws of a biopsy device and/or the like. Actuator position sensors such as resolvers, encoders, potentiometers, and other mechanisms may provide sensor data to the medical system 1100 describing the rotation and orientation of the motor shafts. This position sensor data may be used to determine motion of the objects manipulated by the actuators.

The medical system 1100 also includes a display system 1110 for displaying an image or representation of the surgical site and the medical instrument 1104 generated by sub-systems of a sensor system 1108 and/or any auxiliary information related to a procedure including information related to ablation (e.g., temperature, impedance, energy delivery power levels, frequency, current, energy delivery duration, indicators of tissue ablation, etc.). The display system 1110 and the master assembly 1106 may be oriented so an operator O can control the medical instrument 1104 and the master assembly 1106 with the perception of telepresence.

In some embodiments, the medical instrument 1104 may include components of an imaging system, which may include an imaging scope assembly or imaging instrument that records a concurrent or real-time image of a surgical site and provides the image to the operator O through one or more displays of the medical system 1100, such as one or more displays of the display system 1110. The concurrent image may be, for example, a two or three-dimensional image captured by an imaging instrument positioned within the surgical site. In some embodiments, the imaging system includes endoscopic imaging instrument components that may be integrally or removably coupled to the medical instrument 1104. In some embodiments, however, a separate endoscope, attached to a separate manipulator assembly may be used with the medical instrument 1104 to image the surgical site. In some embodiments, the imaging system includes a channel (not shown) that may provide for a delivery of instruments, devices, catheters, and/or the flexible instruments described herein. The imaging system may be implemented as hardware, firmware, software, or a combination thereof which interact with or are otherwise executed by one or more computer processors, which may include the processors of the control system 1112.

The medical system 1100 may also include the control system 1112. The control system 1112 includes at least one memory and at least one computer processor (not shown) for effecting control the between medical instrument 1104, the master assembly 1106, the sensor system 1108, and the display system 1110. The control system 1112 also includes programmed instructions (e.g., a non-transitory machine-readable medium storing the instructions) to implement some or all of the methods described in accordance with aspects disclosed herein, including instructions for providing information to the display system 1110.

The control system 1112 may optionally further include a virtual visualization system to provide navigation assistance to the operator O when controlling the medical instrument 1104 during an image-guided surgical procedure. Virtual navigation using the virtual visualization system may be based upon reference to an acquired preoperative or intraoperative dataset of anatomic passageways. The virtual visualization system processes images of the surgical site imaged using imaging technology such as computerized tomography (CT), magnetic resonance imaging (MRI), fluoroscopy, thermography, ultrasound, optical coherence tomography (OCT), thermal imaging, impedance imaging, laser imaging, nanotube X-ray imaging, and/or the like.

FIG. 12A is a simplified diagram of a medical instrument system 1200 configured in accordance with various embodiments of the present technology. The medical instrument system 1200 includes an elongate flexible device 1202, such as a flexible catheter, coupled to a drive unit 1204. The elongate flexible device 1202 includes a flexible body 1216 having a proximal end 1217 and a distal end or tip portion 1218. The medical instrument system 1200 further includes a tracking system 1230 for determining the position, orientation, speed, velocity, pose, and/or shape of the distal end 1218 and/or of one or more segments 1224 along the flexible body 1216 using one or more sensors and/or imaging devices as described in further detail below.

The tracking system 1230 may optionally track the distal end 1218 and/or one or more of the segments 1224 using a shape sensor 1222. The shape sensor 1222 may optionally include an optical fiber aligned with the flexible body 1216 (e.g., provided within an interior channel (not shown) or mounted externally). The optical fiber of the shape sensor 1222 forms a fiber optic bend sensor for determining the shape of the flexible body 1216. In one alternative, optical fibers including Fiber Bragg Gratings (FBGs) are used to provide strain measurements in structures in one or more dimensions. Various systems and methods for monitoring the shape and relative position of an optical fiber in three dimensions are described in U.S. Pat. No. 7,781,724, filed Sep. 26, 2006, disclosing "Fiber Optic Position and Shape Sensing Device and Method Relating Thereto"; U.S. Pat. No. 7,772,541, filed Mar. 12, 2008, disclosing "Fiber Optic Position and/or Shape Sensing Based on Rayleigh Scatter"; and U.S. Pat. No. 6,389,187, filed Apr. 21, 2000, disclosing "Optical Fiber Bend Sensor," which are all incorporated by reference herein in their entireties. In some embodiments, the tracking system 1230 may optionally and/or additionally track the distal end 1218 using a position sensor system 1220. The position sensor system 1220 may be a component of an EM sensor system with the position sensor system 1220 including one or more conductive coils that may be subjected to an externally generated electromagnetic field. In some embodiments, the position sensor system 1220 may be configured and positioned to measure six degrees of freedom (e.g., three position coordinates X, Y, and Z and three orientation angles indicating pitch, yaw, and roll of a base point) or five degrees of freedom (e.g., three position coordinates X, Y, and Z and two orientation angles indicating pitch and yaw of a base point). Further description of a position sensor system is provided in U.S. Pat. No. 6,380,732, filed Aug. 9, 1999, disclosing "Six-Degree of Freedom Tracking System Having a Passive Transponder on the Object Being Tracked," which is incorporated by reference herein in its entirety. In some embodiments, an optical fiber sensor may be used to measure temperature or force. In some embodiments, a temperature sensor, a force sensor, an impedance sensor, or other types of sensors may be included within the flexible body. In various embodiments, one or more position sensors (e.g., fiber shape sensors, EM sensors, and/or the like) may be integrated within the medical instrument 1226 and used to track the position, orientation, speed, velocity, pose, and/or shape of a distal end or portion of medical instrument 1226 using the tracking system 1230.

The flexible body 1216 includes a channel 1221 sized and shaped to receive a medical instrument 1226. FIG. 12B, for example, is a simplified diagram of the flexible body 1216 with the medical instrument 1226 extended according to some embodiments. In some embodiments, the medical instrument 1226 may be used for procedures such as imaging, visualization, surgery, biopsy, ablation, illumination, irrigation, and/or suction. The medical instrument 1226 can be deployed through the channel 1221 of the flexible body 1216 and used at a target location within the anatomy. The medical instrument 1226 may include, for example, energy delivery instruments (e.g., an ablation probe), image capture probes, biopsy instruments, laser ablation fibers, and/or other surgical, diagnostic, or therapeutic tools. The medical instrument 1226 may be used with an imaging instrument (e.g., an image capture probe) within the flexible body 1216. The imaging instrument may include a cable coupled to the camera for transmitting the captured image data. In some embodiments, the imaging instrument may be a fiber-optic bundle, such as a fiberscope, that couples to an image processing system 1231. The imaging instrument may be single or multi-spectral, for example capturing image data in one or more of the visible, infrared, and/or ultraviolet spectrums. The medical instrument 1226 may be advanced from the opening of channel 1221 to perform the procedure and then be retracted back into the channel 1221 when the procedure is complete. The medical instrument 1226 may be removed from the proximal end 1217 of the flexible body 1216 or from another optional instrument port (not shown) along the flexible body 1216.

The flexible body 1216 may also house cables, linkages, or other steering controls (not shown) that extend between the drive unit 1204 and the distal end 1218 to controllably bend the distal end 1218 as shown, for example, by broken dashed line depictions 1219 of the distal end 1218. In some embodiments, at least four cables are used to provide independent "up-down" steering to control a pitch of the distal end 1218 and "left-right" steering to control a yaw of the distal end 1218. Steerable elongate flexible devices are described in detail in U.S. Pat. No. 9,452,276, filed Oct. 14, 2011, disclosing "Catheter with Removable Vision Probe," and which is incorporated by reference herein in its entirety. In various embodiments, medical instrument 1226 may be coupled to drive unit 1204 or a separate second drive unit (not shown) and be controllably or robotically bendable using steering controls.

The information from the tracking system 1230 may be sent to a navigation system 1232 where it is combined with information from the image processing system 1231 and/or the preoperatively obtained models to provide the operator with real-time position information. In some embodiments, the real-time position information may be displayed on the display system 1110 of FIG. 11 for use in the control of the medical instrument system 1200. In some embodiments, the control system 1112 of FIG. 11 may utilize the position information as feedback for positioning the medical instrument system 1200. Various systems for using fiber optic sensors to register and display a surgical instrument with surgical images are provided in U.S. Pat. No. 8,900,131, filed May 13, 2011, disclosing "Medical System Providing Dynamic Registration of a Model of an Anatomic Structure for Image-Guided Surgery," which is incorporated by reference herein in its entirety.

In some embodiments, the medical instrument system 1200 may be teleoperated within the medical system 1100 of FIG. 11. In some embodiments, the manipulator assembly 1102 of FIG. 11 may be replaced by direct operator control. In some embodiments, the direct operator control may include various handles and operator interfaces for hand-held operation of the instrument.

EXAMPLES

Several aspects of the present technology are set forth in the following examples. Although several aspects of the present technology are set forth in examples directed to systems, computer-readable mediums, and methods, any of these aspects of the present technology can similarly be set forth in examples directed to any of systems, computer-readable mediums, and methods in other embodiments.

1. A system for performing a medical procedure, the system comprising:
   an elongate flexible device including a proximal portion, a distal portion, and a lumen extending therebetween, wherein the lumen is configured to receive a medical instrument positioned within a target when the elongate flexible device is positioned toward the target;
   a sensor system configured to provide sensor data indicative of a pose of the distal portion of the elongate flexible device;
   a control system configured to actuate at least a portion of the elongate flexible device;
   a processor operably coupled to the elongate flexible device, the sensor system, and the control system; and
   a memory operably coupled to the processor, the memory storing instructions that, when executed by the processor, cause the system to perform operations comprising:
      determining the pose of the distal portion of the elongate flexible device based on the sensor data from the sensor system;
      retracting, via the control system, the elongate flexible device relative to the medical instrument and away from the target; and
      adjusting, via the control system, the pose of the distal portion of the elongate flexible device so the distal portion remains substantially oriented toward the target.

2. The system of example 1, further comprising the medical instrument, wherein the medical instrument is an energy delivery instrument having an antenna positioned at a distal tip section of the energy delivery instrument, and wherein the antenna is configured to radiate energy.

3. The system of example 2 wherein the retracting of the elongate flexible device includes retracting the elongated flexible device by a defined distance, wherein the defined distance is based on positioning the medical instrument so the antenna is partially or fully extended beyond the distal portion of the elongate flexible device.

4. The system of example 3 wherein the operations further comprise repeating the retracting and the adjusting of the elongate flexible device until the elongate flexible device has been retracted by the defined distance.

5. The system of any one of examples 1-4 wherein the operations further comprise altering, via the control system, the pose of the distal portion of the elongate flexible device a defined angle, wherein the defined angle provides for the distal portion to remain substantially oriented toward the target.

6. The system of example 5 wherein the altering of the pose of the distal portion of the elongate flexible device is executed before the retracting of the elongate flexible device.

7. The system of any one of examples 1-6 wherein the retracting and the adjusting of the elongate flexible device comprise constraining the distal portion of the elongate flexible device to a movement range.

8. The system of example 7 wherein the movement range includes a plane aligned with the target or a range of bend angles.

9. The system of any one of examples 1-8 wherein the retracting includes transitioning the elongate flexible device from a stiff state to a passive state in a first retraction mode or a second retraction mode.

10. The system of example 9 wherein:
the first retraction mode includes a first velocity threshold;
the second retraction mode includes a second velocity threshold; and
the second velocity threshold is higher than the first velocity threshold.

11. The system of example 9 wherein the retraction mode is based on a type of elongate flexible device.

12. The system of example 9 wherein the operations further comprise:
determining a type of the medical instrument positioned within the lumen of the flexible elongate device; and
switching of the elongate flexible device from the first retraction mode to the second retraction mode is based on the type of the medical instrument.

13. The system of example 12, further comprising at least one second sensor for determining the type of medical instrument.

14. The system of example 12 wherein the determining of the type of the medical instrument is based on an input received from a user input device.

15. The system of any one of examples 1-14 wherein the altering of the pose of the distal portion of the elongate device, the retracting of the elongate flexible device, or the adjusting of the flexible elongate device result from an input received from a user input device.

16. The system of any one of examples 1-15 wherein the retracting of the elongate flexible device or the adjusting of the flexible elongate device result from a signal generated automatically by the system.

17. The system of any one of examples 1-16 wherein the operations further comprise predicting a change in the pose of the distal portion of the elongate flexible device during the retracting of the elongate flexible device, and wherein the pose of the distal portion is adjusted based, at least in part, on the predicted change.

18. The system of any one of examples 1-17 wherein the control system comprises or is operably coupled to an actuator at the proximal portion of the elongate flexible device, and the actuator is configured to effectuate the retracting and the adjusting of the distal portion of the elongate flexible device.

19. The system of any one of examples 1-18 wherein the adjusting of the pose of the distal portion is based at least in part on the sensor data from the sensor system.

20. The system of any one of examples 1-19 wherein the sensor system includes at least one first sensor coupled to the elongate flexible device.

21. The system of any one of examples 1-20 wherein the sensor data includes image data from an external imaging device.

22. The system of any one of examples 1-21, further comprising a display for receiving image data of an anatomic region including the target and the distal portion of the elongate flexible device and displaying the image data to an operator.

23. A method for performing a medical procedure using an elongate flexible device, the method comprising:
receiving a medical instrument within a lumen of the elongate flexible device;
receiving an input command to position a distal tip section of the medical instrument within a target near a distal portion of the elongate flexible device;
determining a pose of the distal portion of the flexible elongate device based on data from at least one sensing system;
retracting the elongate flexible device away from the distal tip section of the medical instrument; and
adjusting the pose of the distal portion of the elongate flexible device based, at least in part, on the data from the at least one sensing system such that the distal tip section of the medical instrument remains substantially positioned within the target during the retracting and the adjusting of the elongate flexible device.

24. The method of example 23 wherein adjusting the pose of the distal portion comprises adjusting a bend angle of the distal portion.

25. The method of example 23 or example 24, further comprising predicting a change in the pose of the distal portion of the elongate flexible device during retraction, and wherein the pose of the distal portion is adjusted based, at least in part, on the predicted change.

26. The method of any one of examples 23-25, further comprising constraining the distal portion to a movement range during at least one of the retracting or adjusting steps.

27. The method of example 26 wherein the movement range includes a plane aligned with the target or a range of bend angles.

28. The method of any one of examples 23-27 wherein the elongate flexible device is retracted away from the distal tip section of the medical instrument by a defined distance.

29. The method of any one of examples 23-28 wherein the retracting and adjusting steps are performed simultaneously.

30. The method of any one of examples 23-28 wherein the retracting and adjusting steps are performed sequentially.

31. The method of example 30, further comprising repeating the retracting and adjusting steps by retracting the elongate flexible device in incremental distances until the elongate flexible device has been retracted by the defined distance.

32. The method of example 30, further comprising applying energy to the target with the medical instrument after retracting the elongate flexible device by the defined distance, wherein the defined distance is based on positioning an antenna of the medical instrument beyond the distal portion of the elongate flexible device.

33. The method of any one of examples 23-32 wherein the elongate flexible device is configured to operate in a first retraction mode and a second retraction mode, and the retracting is performed in the second retraction mode.

34. The method of example 32, further comprising:
   detecting a type of the medical instrument received within the lumen of the elongate flexible device; and
   switching from the first retraction mode to the second retraction mode based on the type of medical instrument.

35. The method of example 33 wherein switching from the first retraction mode to the second retraction mode includes one or more of the following:
   changing a velocity threshold of the elongate flexible device; or
   changing the elongate flexible device from a stiff state to a passive state.

36. A non-transitory, computer-readable medium storing instructions thereon that, when executed by one or more processors of a computing system, cause the computing system to perform the method of any one of examples 23-35.

37. A system for performing a medical procedure at a target site, the system comprising:
   an elongate flexible device including a distal portion configured to be positioned near the target site, the elongate flexible device including at least one sensor; and
   a processor operably coupled to the at least one sensor;
   a memory operably coupled to the processor, the memory storing instructions that, when executed by the processor, cause the system to output a user interface for providing guidance, the guidance comprising:
      a first indicator representing a current pose of the distal portion of the elongate flexible device, wherein the current pose is based on data from the at least one sensor; and
      a second indicator corresponding to a target movement range for adjusting the distal portion of the elongate flexible device to remain oriented toward the target site during retraction of the elongate flexible device away from the target site.

38. The system of example 37 wherein the first indicator and second indicator are updated as the operator retracts the elongate flexible device away from the target site.

39. The system of example 37 or example 38 wherein the guidance further comprises a third indicator representing a location of the target site.

40. The system of example 39 wherein the target movement range includes a plane aligned with the target site.

41. The system of any one of examples 37-40 wherein the target movement range includes a range of bend angles for the distal portion of the elongate flexible device.

42. The system of any one of examples 37-41 wherein the second indicator comprises an adjusted position and an adjusted orientation for the distal portion of the elongate flexible device.

43. The system of any one of examples 37-42 wherein the guidance further comprises a fourth indicator representing a constrained movement range, wherein the constrained movement range constrains the distal portion during retraction of the elongate flexible device.

44. The system of example 43 wherein the constrained movement range includes a plane aligned with the target site or a range of bend angles for the distal portion of the elongate flexible device.

45. The system of any one of examples 37-44 wherein the second indicator further comprises a notification indicating that a measured retraction distance of the elongate flexible device is greater than or equal to a desired retraction distance of the elongate flexible device.

46. The system of any one of example 37-45 wherein the second indicator is a visual indicator, audible indicator, or haptic indicator.

47. The system of example 46 wherein the second indicator is the visual indicator, and wherein the visual indicator includes one or more of the following: a line element, an arrow, or a vector.

48. The system of example 47 wherein the visual indicator includes a first arrow representing a current plane of the distal portion of the elongate flexible device, and a second arrow representing an adjusted plane of the distal portion of the elongate flexible device.

49. The system of example 47 wherein the visual indicator is overlaid onto image data of the anatomic region.

50. A method for performing a medical procedure at a target site, the method comprising:
   determining a current pose of a distal portion of an elongate flexible device positioned near a target site based on data received from at least one pose sensor associated with the elongate flexible device;
   determining an adjusted pose of the distal portion of the elongate flexible device, wherein the adjusted pose orients the distal portion of the elongate flexible device toward the target site during retraction of the elongate flexible device away from the target site; and
   providing guidance for adjusting the distal portion of the elongate flexible device from the current pose to the adjusted pose, wherein the guidance includes a target movement range.

51. The method of example 50 wherein the guidance includes a representation of the current pose of the elongate flexible device.

52. The method of example 50 or example 51, further comprising determining a location of the target site in the anatomic region.

53. The method of example 52 wherein the guidance comprises a first indicator representing the location of the target site.

54. The method of example 52 wherein the location of the target site is determined based on image data from an imaging system.

55. The method of example 52 wherein the location of the target site is determined based on a projection from the current pose of the distal portion of the elongate flexible device.

56. The method of any one of examples 50-55 wherein the adjusted pose is determined based on a measured pose of the distal portion of the elongate flexible device prior to the retraction of the elongate flexible device.

57. The method of example 56 wherein the adjusted pose has substantially the same bend angle as the measured pose prior to the retraction of elongate flexible device.

58. The method of any one of examples 50-55 wherein the adjusted pose is determined based on a retraction distance and at least one property of the elongate flexible device.

59. The method of any one of examples 50-55 wherein the adjusted pose is determined based on a location of the target site.

60. The method of any one of examples 50-55 wherein the adjusted pose is determined based on a difference between a current bend angle of the distal portion and a target bend angle to orient the distal portion toward the target site.

61. The method of any one of examples 50-60 wherein the guidance includes a second indicator representing an adjustment to the distal portion of the elongate flexible device to orient the distal portion toward the target site, based on a determined pose of the distal portion and a location of the target site.

62. The method any one of examples 50-61 wherein the guidance includes a third indicator representing a constrained movement range, wherein the constrained movement range constrains the distal portion during the retraction of the elongate flexible device.

63. The method of any one of examples 50-62, further comprising:
   introducing a medical instrument to the target site via a lumen of the elongate flexible device, wherein the guidance is configured to guide an operator in adjusting the distal portion of the elongate flexible device so the medical instrument remains at or near the target site.

64. A non-transitory, computer-readable medium storing instructions thereon that, when executed by one or more processors of a computing system, cause the computing system to perform operations for the method of any of examples 50-63.

CONCLUSION

The systems and methods described herein can be provided in the form of tangible and non-transitory machine-readable medium or media (such as a hard disk drive, hardware memory, optical medium, semiconductor medium, magnetic medium, etc.) having instructions recorded thereon for execution by a processor or computer. The set of instructions can include various commands that instruct the computer or processor to perform specific operations such as the methods and processes of the various embodiments described here. The set of instructions can be in the form of a software program or application. Programmed instructions may be implemented as a number of separate programs or subroutines, or they may be integrated into a number of other aspects of the systems described herein. The computer storage media can include volatile and non-volatile media, and removable and non-removable media, for storage of information such as computer-readable instructions, data structures, program modules or other data. The computer storage media can include, but are not limited to, RAM, ROM, EPROM, EEPROM, flash memory or other solid-state memory technology, CD-ROM, DVD, or other optical storage, magnetic disk storage, or any other hardware medium which can be used to store desired information and that can be accessed by components of the system. Components of the system can communicate with each other via wired or wireless communication. In one embodiment, the control system supports wireless communication protocols such as Bluetooth, IrDA, HomeRF, IEEE 802.11, DECT, and Wireless Telemetry. The components can be separate from each other, or various combinations of components can be integrated together into a monitor or processor or contained within a workstation with standard computer hardware (for example, processors, circuitry, logic circuits, memory, and the like). The system can include processing devices such as microprocessors, microcontrollers, integrated circuits, control units, storage media, and other hardware.

Medical tools that may be delivered through the elongate flexible devices or catheters disclosed herein may include, for example, image capture probes, biopsy instruments, laser ablation fibers, and/or other surgical, diagnostic, or therapeutic tools. Medical tools may include end effectors having a single working member such as a scalpel, a blunt blade, an optical fiber, an electrode, and/or the like. Other end effectors may include, for example, forceps, graspers, scissors, clip appliers, and/or the like. Other end effectors may further include electrically activated end effectors such as electro-surgical electrodes, transducers, sensors, and/or the like. Medical tools may include image capture probes that include a stereoscopic or monoscopic camera for capturing images (including video images). Medical tools may additionally house cables, linkages, or other actuation controls (not shown) that extend between their proximal and distal ends to controllably bend the distal ends of the tools. Steerable instruments are described in detail in U.S. Pat. No. 7,316,681, filed Oct. 4, 2005, disclosing "Articulated Surgical Instrument for Performing Minimally Invasive Surgery with Enhanced Dexterity and Sensitivity" and U.S. Pat. No. 9,259,274, filed Sep. 30, 2008, disclosing "Passive Preload and Capstan Drive for Surgical Instruments," which are incorporated by reference herein in their entireties.

The systems described herein may be suited for navigation and treatment of anatomic tissues, via natural or surgically created connected passageways, in any of a variety of anatomic systems, including the lung, colon, stomach, intestines, kidneys and kidney calices, bladder, liver, gall bladder, pancreas, spleen, ureter, ovaries, uterus, brain, the circulatory system including the heart, vasculature, and/or the like.

Note that the processes and displays presented may not inherently be related to any particular computer or other apparatus. Various general-purpose systems may be used with programs in accordance with the teachings herein, or it may prove convenient to construct a more specialized apparatus to perform the operations described. The required structure for a variety of these systems will appear as elements in the claims. In addition, the embodiments of the invention are not described with reference to any particular programming language. It will be appreciated that a variety of programming languages may be used to implement the teachings of the invention as described herein.

While certain exemplary embodiments of the invention have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any materials incorporated herein by reference conflict with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. As used herein, the phrase "and/or" as in "A and/or B" refers to A alone, B alone, and both A and B. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded.

Furthermore, as used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

From the foregoing, it will also be appreciated that various modifications can be made without deviating from the technology. For example, various components of the technology can be further divided into subcomponents, or various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A system for performing a medical procedure, the system comprising:
    an elongate flexible device including a proximal portion, a distal portion, and a lumen extending therebetween, wherein the lumen is configured to receive a medical instrument;
    a sensor system configured to provide sensor data indicative of a pose of the distal portion of the elongate flexible device;
    a control system configured to actuate at least a portion of the elongate flexible device;
    a processor operably coupled to the elongate flexible device, the sensor system, and the control system; and
    a memory operably coupled to the processor, the memory storing instructions that, when executed by the processor, cause the system to perform operations comprising:
        determining the pose of the distal portion of the elongate flexible device based on the sensor data from the sensor system;
        retracting, via the control system, the elongate flexible device relative to the medical instrument and away from a target; and
        adjusting, via the control system, the pose of the distal portion of the elongate flexible device so the distal portion remains substantially oriented toward the target after the retracting.

2. The system of claim 1, further comprising the medical instrument, wherein the medical instrument is an energy delivery instrument having an antenna positioned at a distal tip section of the energy delivery instrument, and wherein the antenna is configured to radiate energy.

3. The system of claim 2 wherein the retracting of the elongate flexible device includes retracting the elongate flexible device by a defined distance, wherein the defined distance is based on positioning the medical instrument so the antenna is partially or fully extended beyond the distal portion of the elongate flexible device.

4. The system of claim 3 wherein the operations further comprise repeating the retracting and the adjusting of the elongate flexible device until the elongate flexible device has been retracted by the defined distance.

5. The system of claim 1 wherein the operations further comprise altering, via the control system, the pose of the distal portion of the elongate flexible device a defined angle, wherein the defined angle provides for the distal portion to remain substantially oriented toward the target.

6. The system of claim 5 wherein the altering of the pose of the distal portion of the elongate flexible device is executed before the retracting of the elongate flexible device.

7. The system of claim 1 wherein the retracting and the adjusting of the elongate flexible device comprise constraining the distal portion of the elongate flexible device to a movement range.

8. The system of claim 7 wherein the movement range includes a plane aligned with the target or a range of bend angles.

9. The system of claim 1 wherein the retracting includes transitioning the elongate flexible device from a stiff state to a passive state in a first retraction mode or a second retraction mode.

10. The system of claim 9 wherein:
    the first retraction mode includes a first velocity threshold;
    the second retraction mode includes a second velocity threshold; and
    the second velocity threshold is higher than the first velocity threshold.

11. The system of claim 10 wherein the first retraction mode is based on a type of elongate flexible device.

12. The system of claim 9 wherein the operations further comprise:
    determining a type of the medical instrument positioned within the lumen of the flexible elongate device; and
    switching the elongate flexible device from the first retraction mode to the second retraction mode based on the type of the medical instrument.

13. The system of claim 12, further comprising at least one second sensor for determining the type of medical instrument.

14. The system of claim 13 wherein the determining of the type of the medical instrument is based on an input received from a user input device.

15. The system of claim 1 wherein retracting the elongate flexible device or the adjusting the pose of the distal portion of the elongate flexible device result from an input received from a user input device.

16. The system of claim 1 wherein the retracting the elongate flexible device or the adjusting the pose of the distal portion of the elongate flexible device result from a signal generated automatically by the system.

17. The system of claim 1 wherein the operations further comprise predicting a change in the pose of the distal portion of the elongate flexible device during the retracting of the elongate flexible device, and wherein the pose of the distal portion is adjusted based, at least in part, on the predicted change.

18. The system of claim 1 wherein the control system comprises or is operably coupled to an actuator at the proximal portion of the elongate flexible device, and the actuator is configured to effectuate the retracting and the adjusting of the distal portion of the elongate flexible device.

19. The system of claim 1 wherein the adjusting of the pose of the distal portion is based at least in part on the sensor data from the sensor system.

20. The system of claim 1 wherein the sensor system includes at least one first sensor coupled to the elongate flexible device.

* * * * *